United States Patent
Ota

(10) Patent No.: US 7,146,597 B2
(45) Date of Patent: Dec. 5, 2006

(54) CAD METHOD FOR ARRANGING VIA-HOLES, A CAD TOOL, PHOTOMASKS PRODUCED BY THE CAD METHOD, A SEMICONDUCTOR INTEGRATED CIRCUIT MANUFACTURED WITH PHOTOMASKS AND A COMPUTER PROGRAM PRODUCT FOR EXECUTING THE CAD METHOD

(75) Inventor: Yuzo Ota, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 240 days.

(21) Appl. No.: 10/951,858

(22) Filed: Sep. 27, 2004

(65) Prior Publication Data

US 2005/0108673 A1    May 19, 2005

(30) Foreign Application Priority Data

Oct. 1, 2003    (JP) .......................... P2003-343302

(51) Int. Cl.
  *G06F 17/50* (2006.01)
  *H01L 21/4763* (2006.01)
  *H01L 23/52* (2006.01)
(52) U.S. Cl. .............................. 716/12; 716/8; 716/19; 438/618; 257/773
(58) Field of Classification Search ................ 716/1, 716/28, 12–14, 19; 438/618, 622, 637, 6; 257/773
See application file for complete search history.

(56) References Cited

U.S. PATENT DOCUMENTS

| | | | | |
|---|---|---|---|---|
| 6,035,111 | A | * | 3/2000 | Suzuki et al. .................. 716/11 |
| 6,349,403 | B1 | * | 2/2002 | Dutta et al. ................... 716/12 |
| 6,507,941 | B1 | * | 1/2003 | Leung et al. .................. 716/14 |
| 6,870,255 | B1 | * | 3/2005 | Teig et al. ................... 257/700 |
| 6,900,540 | B1 | * | 5/2005 | Teig et al. ................... 257/758 |
| 2003/0121018 | A1 | * | 6/2003 | Leung et al. .................. 716/12 |
| 2004/0181765 | A1 | * | 9/2004 | Kato ........................... 716/12 |
| 2005/0240894 | A1 | * | 10/2005 | Teig et al. ..................... 716/14 |

FOREIGN PATENT DOCUMENTS

JP          2001-284455         10/2001

* cited by examiner

*Primary Examiner*—Stacy A Whitmore
(74) *Attorney, Agent, or Firm*—DLA Piper US LLP

(57) ABSTRACT

A design method encompasses: determining a direction of a subject wiring level in a multi-level interconnection of semiconductor integrated circuit as a subject-level priority direction; designing a layout of the subject wiring level, by placing a subject-level strip extending along the subject-level priority; generating a subject-level extension extending in a different direction of the subject-level priority direction, from a termination of the subject-level strip; allocating via-holes in the subject-level extension; and designing a layout of a neighboring wiring level of the subject wiring level, by placing a neighboring-level strip extending along the same direction as the subject-level extension extends, so that a termination of the neighboring-level strip can include the via-holes.

20 Claims, 16 Drawing Sheets

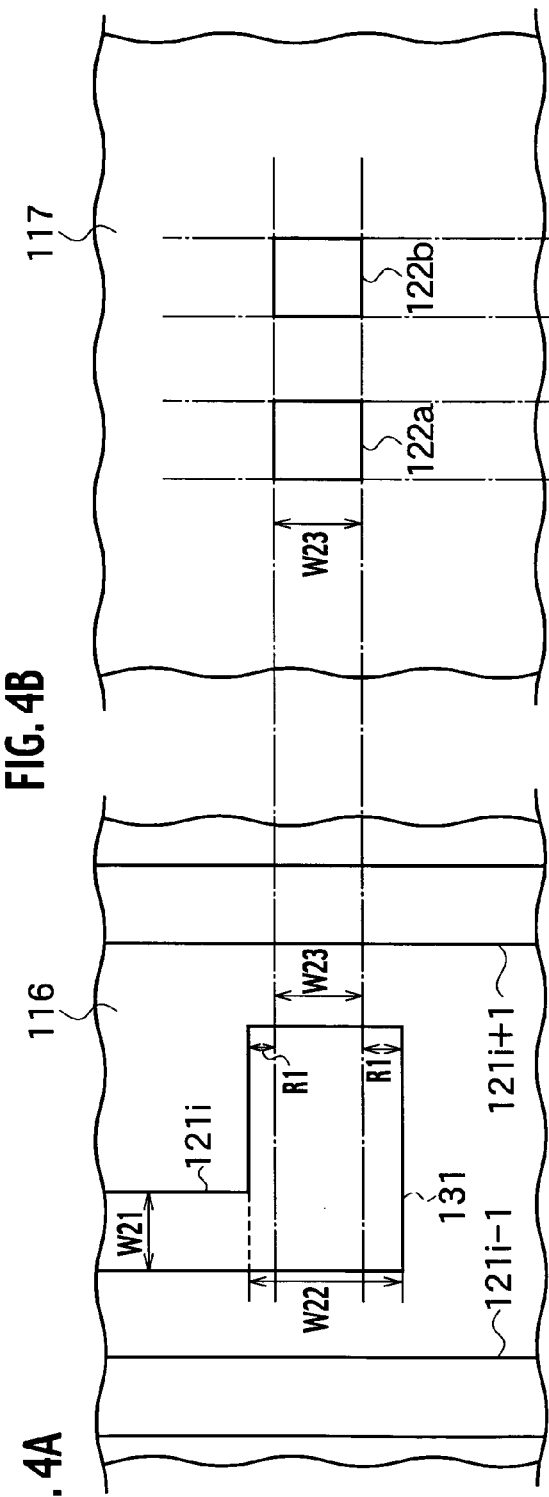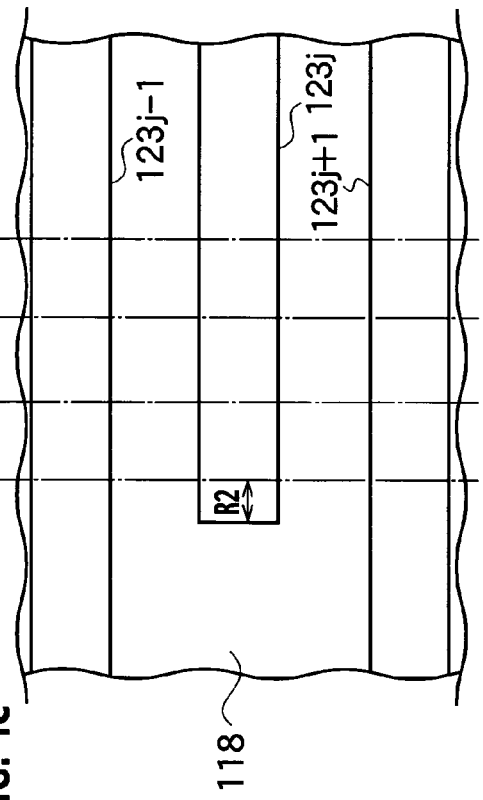

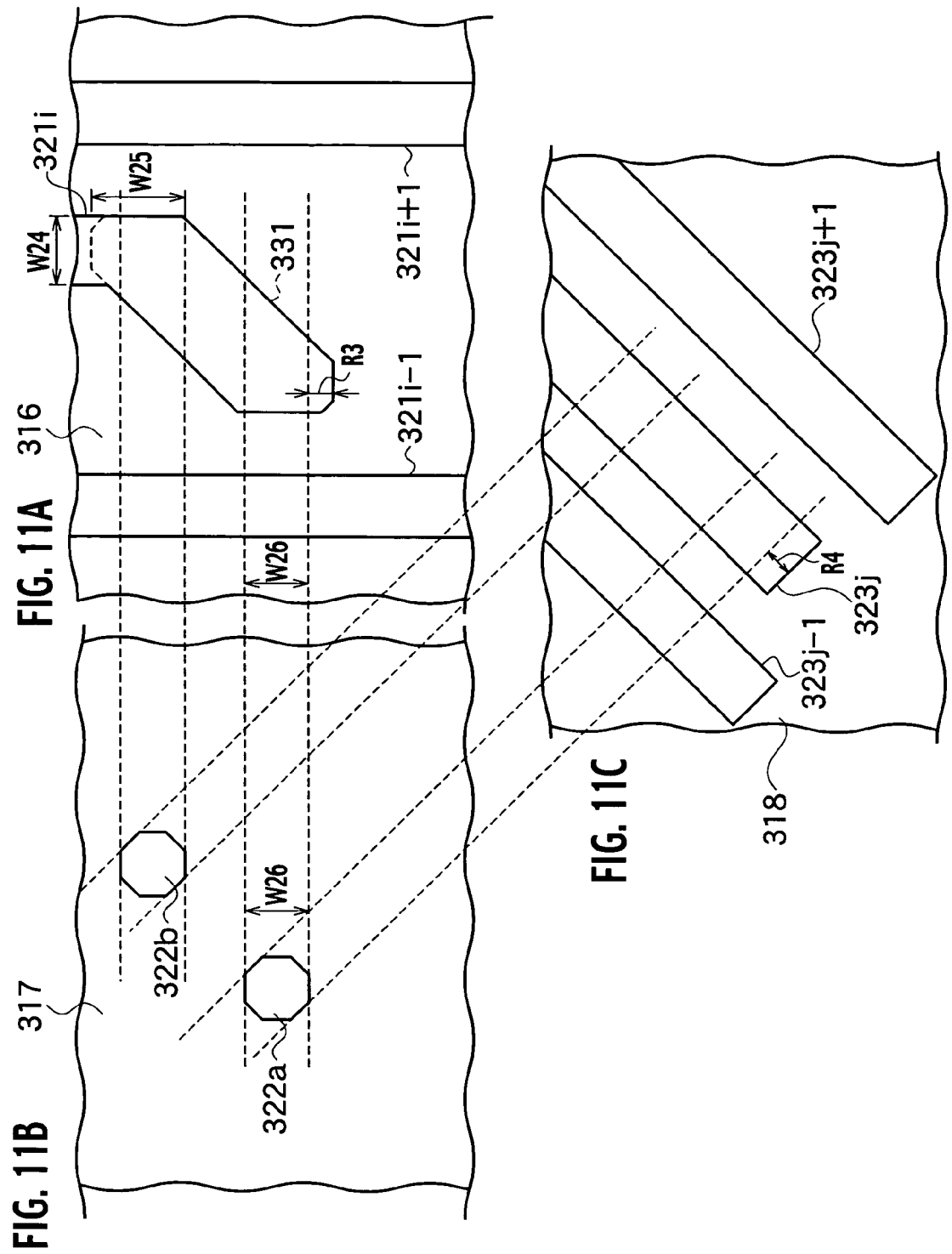

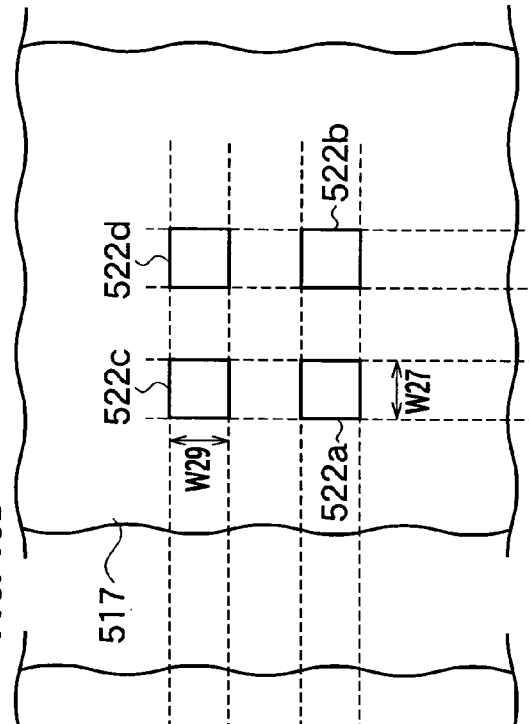
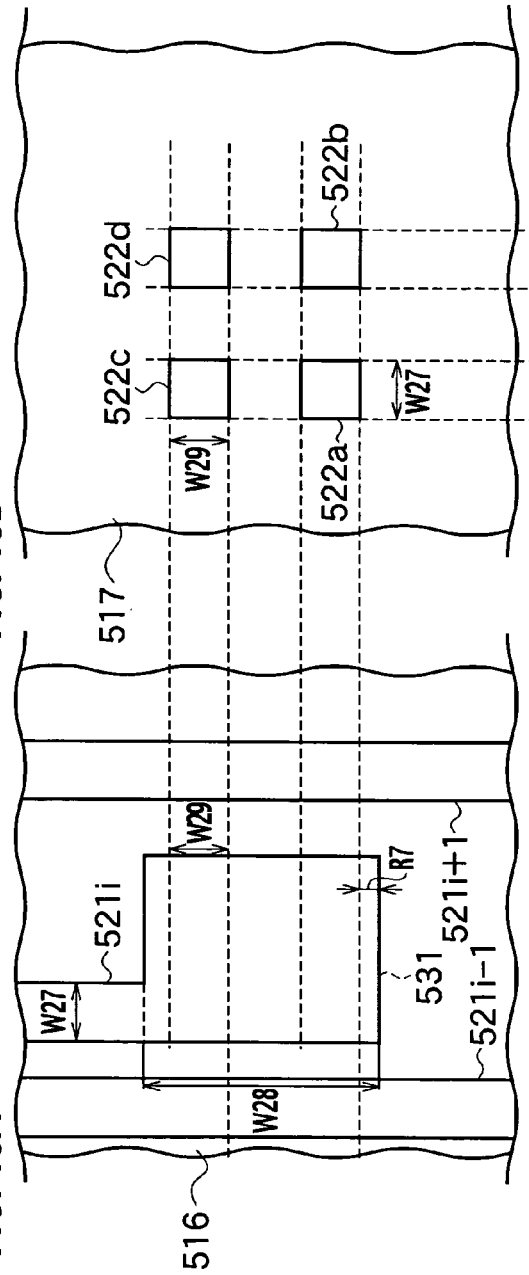
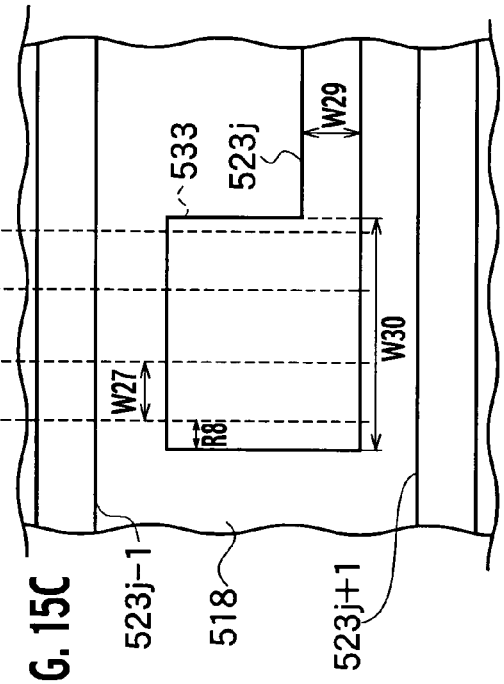

CAD METHOD FOR ARRANGING VIA-HOLES, A CAD TOOL, PHOTOMASKS PRODUCED BY THE CAD METHOD, A SEMICONDUCTOR INTEGRATED CIRCUIT MANUFACTURED WITH PHOTOMASKS AND A COMPUTER PROGRAM PRODUCT FOR EXECUTING THE CAD METHOD

CROSS REFERENCE TO RELATED APPLICATIONS

This application claims benefit of priority under 35 USC 119 based on Japanese Patent Application No. P2003-343302 filed Oct. 1, 2003, the entire contents of which are incorporated by reference herein.

BACKGROUND OF THE INVENTION

1. Field of the Invention

The present invention relates to a computer-aided design (CAD) method, a CAD tool, a set of photomasks produced by the CAD method, a semiconductor integrated circuit manufactured employing the set of photomasks and a computer program product for executing the CAD method, and in particular to a configuration for arranging via-holes at a termination of a interconnection, which implements a multi-level interconnection.

2. Description of the Related Art

Recently, with the miniaturization of the feature size of semiconductor integrated circuits, it becomes difficult to establish a geometry of metallic wirings configured to interconnect between circuit elements as designed. For example, a termination of a metallic wiring on one wiring level in a multi-level interconnection becomes shorter than the length of normally designed configuration. And because of misalignment in overlay accuracy from upper to lower wiring levels, in the photolithography process, such a phenomenon (shortening) occurs, as an upper metallic wiring does not reach the position of a via-hole which is supposed to connect the upper metallic wiring to a lower metallic wiring, and defective connection is generated. And, with advancements in miniaturization of semiconductor integrated circuits, since it becomes difficult to bury metallic material in a small via-hole, wiring failures such as disconnection and poor contact occur.

Therefore, to solve these problems, a CAD method for preventing defective connection is proposed, in which four extension regions are provided in front and rear ends and on right and left sides of a rectangular space disposed at an end (a termination) of a lower metallic wiring, a via-hole connecting the subject (lower) and upper wiring levels penetrates to the rectangular space, and upper metallic wiring can reach the via-hole, even if shorting between the subject (lower) and upper wiring levels does occur.

However, according to the above-mentioned CAD method, where a wiring grid (wiring lattice) is first set at each wiring level and metallic wirings are arranged in reference to the wiring grid, wiring efficiency becomes low because the extension regions occupy the triple wiring lattices (the wiring grid) located adjacent both sides of the corresponding metallic wiring. Especially, in a case where more than two via plugs were formed in the termination of metallic wiring, extension regions in a large area spanning over more than two via plugs must be established, and the extension regions an even larger space to include additional wiring grids located adjacent on both sides of the corresponding metallic wiring, this causes even lowered wiring efficiency.

SUMMARY OF THE INVENTION

An aspect of present invention inheres in a computer-aided design method of interconnections of a semiconductor integrated circuit based upon a wiring grid, the wiring grid implemented by a plurality of regularly spaced first lines and a plurality of regularly spaced second lines intersecting with the first lines, encompassing determining a direction of a subject wiring level in a multi-level interconnection of semiconductor integrated circuit as a subject-level priority direction with reference to the wiring grid; designing a layout of the subject wiring level, by placing a subject-level strip extending along the subject-level priority direction in the subject wiring level; generating a subject-level extension extending in a different direction of the subject-level priority direction, from a termination of the subject-level strip, so that a dimension of the subject-level extension measured along the subject-level priority direction is larger than a width of the subject-level strip; allocating a plurality of via-holes in the subject-level extension at the intersecting points of the wiring grid along a direction in which the subject-level extension extend, leaving a margin along the subject-level priority direction; and designing a layout of a neighboring wiring level of the subject wiring level in the multi-level interconnection, by placing a neighboring-level strip extending along the same direction as the subject-level extension extends, so that a termination of the neighboring-level strip can include the via-holes.

Another aspect of present invention inheres in a designing tool of interconnections of a semiconductor integrated circuit based upon a wiring grid, the wiring grid implemented by a plurality of regularly spaced first lines and a plurality of regularly spaced second lines intersecting with the first lines, encompassing: a condition setting module configured to determine a direction of a subject wiring level in a multi-level interconnection of semiconductor integrated circuit as a subject-level priority direction with reference to the wiring grid so as to set an interconnect condition; a subject-level interconnect setting logic configured to design a layout of the subject wiring level, by placing a subject-level strip extending along the subject-level priority direction in the subject wiring level; a subject-level extension setting logic configured to generate a subject-level extension extending in a different direction of the subject-level priority direction, from a termination of the subject-level strip, so that a dimension of the subject-level extension measured along the subject-level priority direction is larger than a width of the subject-level strip; a via setting logic configured to allocate a plurality of via-holes in the subject-level extension at the intersecting points of the wiring grid along a direction in which the subject-level extension extend, leaving a margin along the subject-level priority direction; and a neighboring-level interconnect setting logic configured to design a layout of a neighboring wiring level of the subject wiring level in the multi-level interconnection, by placing a neighboring-level strip extending along the same direction as the subject-level extension extends, so that a termination of the neighboring-level strip can include the via-holes.

Still another aspect of present invention inheres in a photomask set for photolithography used in a manufacturing of a semiconductor integrated circuit, encompassing: a first photomask configured to form a layout of a subject wiring level in a multi-level interconnection of the semiconductor integrated circuit; a second photomask aligned with a projected image of the first photomask, the second photomask encompassing a plurality of windows formed in a light shielding film on a second photomask substrate, the windows are so designed that the windows can be aligned with the projected image of the subject-level extension, leaving a margin along the subject-level priority direction; and a third photomask configured to form a layout of a neighboring wiring level of the subject wiring level, the third photomask encompassing a pattern of a neighboring-level strip extending along the same direction as the pattern of the subject-level extension pattern extends, the pattern of the neighboring-level strip is delineated by a light shielding film on a third photomask substrate, such that a termination of the pattern of the neighboring-level strip can include projected images of the windows. Here, the first photomask encompasses: a pattern of a subject-level strip delineated by a light shielding film so as to extend along a subject-level priority direction on a first photomask substrate; and a pattern of a subject-level extension extending in a different direction of the subject-level priority direction, from a termination of the pattern of the subject-level strip, so that a dimension of the pattern of the subject-level extension measured along the subject-level priority direction is larger than a width of the pattern of the subject-level strip.

Yet still another aspect of present invention inheres in a semiconductor integrated circuit, encompassing: a layout of a subject wiring level formed by conductive material in a multi-level interconnection of the semiconductor integrated circuit, the layout of the subject wiring level encompassing: a subject-level strip to extending along a subject-level priority direction; and a subject-level extension extending in a different direction of the subject-level priority direction, from a termination of the subject-level strip, so that a dimension of the subject-level extension measured along the subject-level priority direction is larger than a width of the subject-level strip. The semiconductor integrated circuit further encompasses: an interlevel dielectric film contacting to the layout of the subject wiring level; a plurality of via plugs buried in the interlevel dielectric film so as to electrically contact with the subject-level extension, leaving a margin along the subject-level priority direction; and a layout of a neighboring wiring level of the subject wiring level, the neighboring wiring level encompassing a neighboring-level strip extending along the same direction as the subject-level extension pattern extends, a termination of the neighboring-level strip electrically contact with the via plugs.

Further aspect of present invention inheres in a computer program product for executing a design method of interconnections of a semiconductor integrated circuit based upon a wiring grid, the wiring grid implemented by a plurality of regularly spaced first lines and a plurality of regularly spaced second lines intersecting with the first lines within a designing tool, the computer program product encompassing: instructions to determine a direction of a subject wiring level in a multi-level interconnection of semiconductor integrated circuit as a subject-level priority direction with reference to the wiring grid; instructions to design a layout of the subject wiring level, by placing a subject-level strip extending along the subject-level priority direction in the subject wiring level; instructions to generate a subject-level extension extending in a different direction of the subject-level priority direction, from a termination of the subject-level strip, so that a dimension of the subject-level extension measured along the subject-level priority direction is larger than a width of the subject-level strip; instructions to allocate a plurality of via-holes in the subject-level extension at the intersecting points of the wiring grid along a direction in which the subject-level extension extend, leaving a margin along the subject-level priority direction; and instructions to design a layout of a neighboring wiring level of the subject wiring level in the multi-level interconnection, by placing a neighboring-level strip extending along the same direction as the subject-level extension extends, so that a termination of the neighboring-level strip can include the via-holes.

BRIEF DESCRIPTION OF THE DRAWINGS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.

FIG. 4A is a plan view showing a pattern of a first photomask according to the first embodiment;

FIG. 4B is a plan view showing a pattern of a second photomask according to the first embodiment;

FIG. 4C is a plan view showing a pattern of a third photomask according to the first embodiment;

FIG. 11A is a plan view showing a pattern of a first photomask according to the second embodiment;

FIG. 11B is a plan view showing a pattern of a second photomask according to the second embodiment;

FIG. 11C is a plan view showing a pattern of a third photomask according to the second embodiment;

FIG. 15A is a plan view showing a pattern of a first photomask according to the third embodiment;

FIG. 15B is a plan view showing a pattern of a second photomask according to the third embodiment; and FIG. 15C is a plan view showing a pattern of a third photomask according to the third embodiment.

DETAILED DESCRIPTION OF THE EMBODIMENTS

In the following description specific details are set forth, such as specific materials, process and equipment in order to provide a thorough understanding of the present invention. It will be apparent, however, to one skilled in the art that the present invention may be practiced without these specific details. In other instances, well-known manufacturing materials, process and equipment are not set forth in detail in order not to unnecessary obscure the present invention.

Prepositions, such as "on", "over", "under", "beneath", and "normal" are defined with respect to a planar surface of the substrate, regardless of the orientation in which the substrate is actually held. A layer is on another layer even if there are intervening layers.

First Embodiment

<1.1 Designing Tool>

Figure 1A:
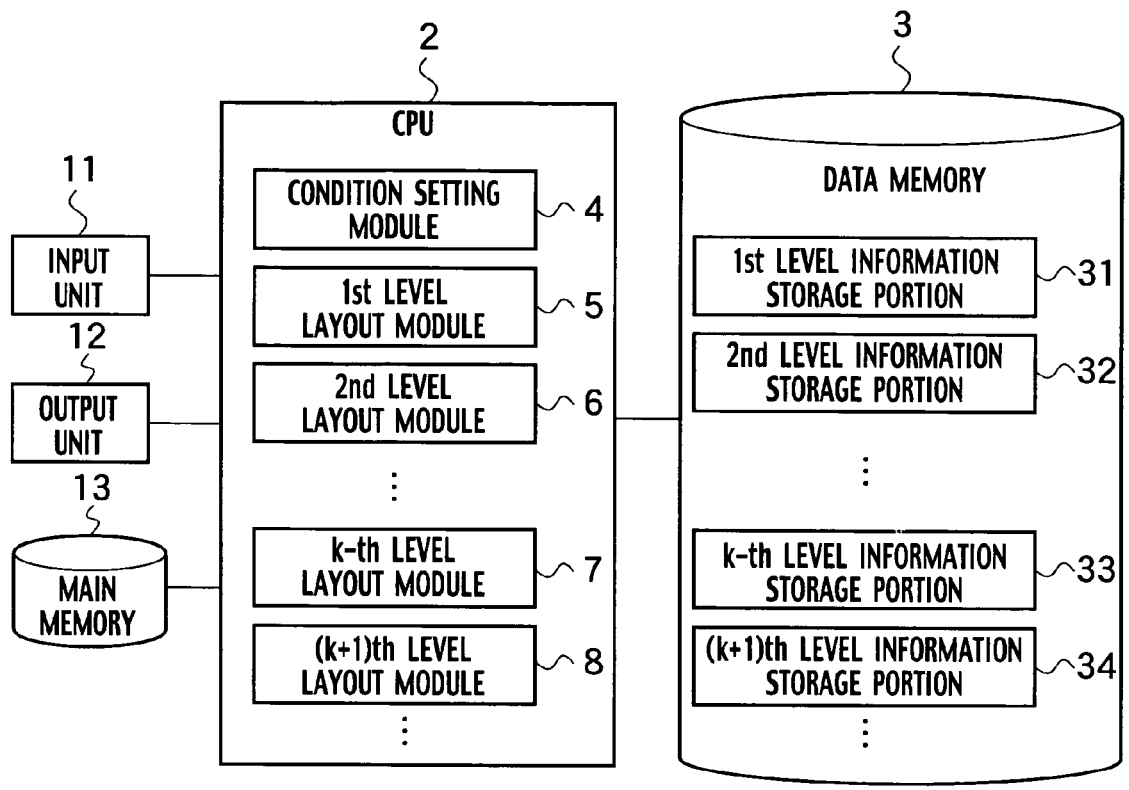
FIG. 1A is a common block diagram showing the configuration of a designing tool associated with first to the third embodiments.

As shown in FIG. 1A, a designing tool according to a first embodiment of the present invention includes a central processing unit (CPU) 2, a data memory 3, an input unit 11, an output unit 12 and a main memory 13.

Figure 2A:
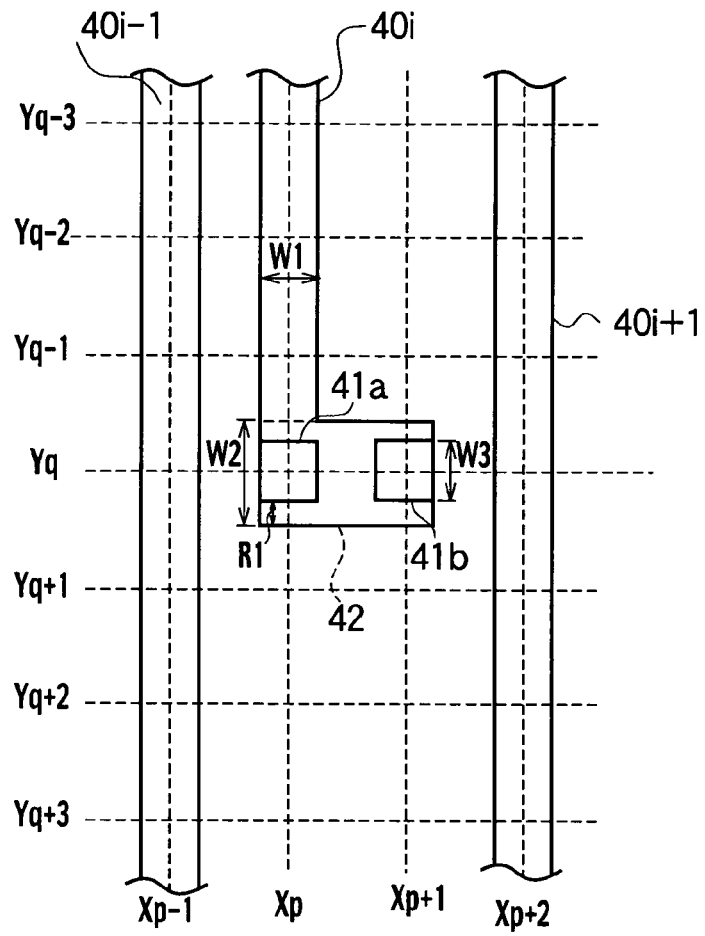
FIG. 2A is a plan view showing a layout design of k-th wiring level which is designed by a designing tool according to the first embodiment.
Figure 2B:
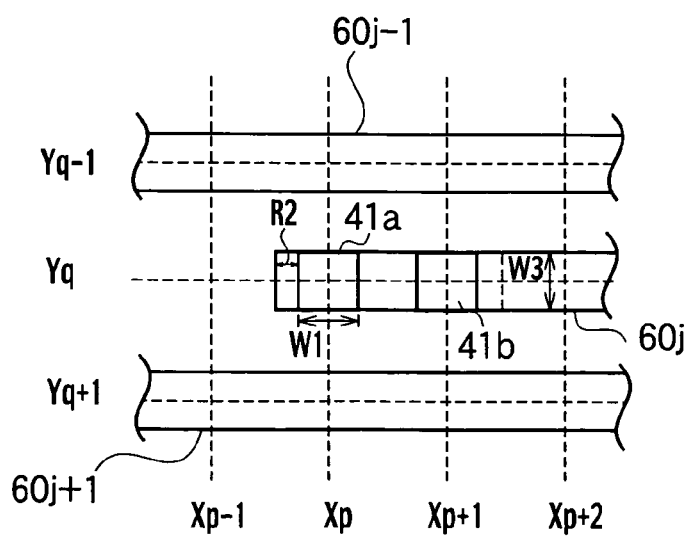
FIG. 2B is a plan view showing a layout design of (k+1)th wiring level which is designed by the designing tool according to the first embodiment.

As shown in FIG. 2A and FIG. 2B, the CPU 2 executes the processing of the designing tool on the basis of wiring grids which are implemented by a plurality of regularly spaced first lines $X_{p-1}$, $X_p$, $X_{p+1}$, . . . , each of which runs in parallel along a fixed direction (vertical direction) and by a plurality of regularly spaced second lines $Y_{q-1}$, $Y_q$, $Y_{q+1}$, . . . , each of which runs in parallel along such a direction (horizontal direction) as intersects orthogonally to the regularly spaced first lines $X_{p-1}$, $X_p$, $X_{p+1}$, . . . ("p" and "q" are integers, respectively). Therefore, the CPU 2 encompasses a condition setting module 4 configured to set the wiring condition of specific wiring level, a first level layout module 5 configured to layout the first wiring level, a second level layout module 6 configured to layout the second wiring level, . . . , a k-th level layout module 7 configured to layout a k-th wiring level and a (k+1)th level layout module 8 configured to layout a (k+1)th wiring level, . . . The condition setting module 4 defines a priority direction of the k-th wiring level as "the k-th level priority direction", based on the k-th level wiring information, in reference to the wiring grid which is implemented by the regularly spaced first lines $X_{p-1}$, $X_p$, $X_{p+1}$, . . . and the regularly spaced second lines $Y_{q-1}$, $Y_q$, $Y_{q+1}$, . . . The k-th level priority direction may be the direction of the first lines $X_{p-1}$, $X_p$, $X_{p+1}$, . . . or the second lines $Y_{q-1}$, $Y_q$, $Y_{q+1}$, . . . .

Here, if we elect the k-th wiring level as "a subject wiring level", the (k+1)th wiring level is "a neighboring wiring level" of the subject wiring level. In this case, the neighboring wiring level is "an upper wiring level" disposed at upper level than the subject wiring level. The k-th level layout module 7 becomes "a subject level layout module" configured to layout the subject wiring level. And, the (k+1)th level layout module 8 becomes "a neighboring level layout module" configured to layout the neighboring wiring level. Then, the condition setting module 4 defines one of directions of the subject wiring level as "the subject level priority direction", based on the subject level wiring information, in reference to the wiring grid. However, the subject wiring level may be elected freely other than the k-th wiring level. Actually, to establish a multilevel interconnection, all of the first wiring level, the second wiring level, the third wiring level, . . . , the k-th wiring level, the (k+1)th wiring level, . . . , may serve sequentially as the role of the subject wiring level, except the upper most wiring level, when we define the neighboring wiring level as the upper wiring level of the subject wiring level.

Figure 1B:
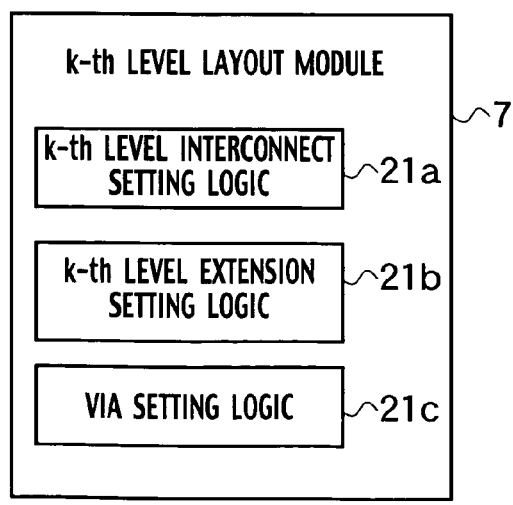
FIG. 1B is a common block diagram showing an organization of the k-th level layout module of the designing tool according to the first to third embodiments.

Further, as shown in FIG. 1B, the k-th level layout module 7 includes a k-th level interconnect setting logic 21$a$, a k-th level extension setting logic 21$b$ and a via setting logic 21$c$.

As shown in FIG. 2A, the k-th level interconnect setting logic 21$a$ designs layouts of a first strip pattern $40_{i-1}$ of the k-th wiring level, a second strip pattern $40_i$ of the k-th wiring level and a third strip pattern $40_{i+1}$ of the k-th wiring level which extend in the k-th wiring level along the k-th level priority direction ("i" is an integer).

The k-th level extension setting logic 21$b$ generates a pattern of a k-th level extension 42 configured to extend in an orthogonal direction to the k-th level priority direction from a termination of the second strip pattern $40_i$ of the k-th wiring level, so that the dimension W2 measured along the k-th level priority direction becomes larger than the line width W1 of the second strip pattern $40_i$ of the k-th wiring level.

The via setting logic 21$c$ arranges linearly a plurality of via-holes 41$a$ and 41$b$ at the intersection points of the parallel lines $X_p$, $X_{p+1}$ and the line $Y_q$ in such a direction as the k-th level extension 42 extends. The patterns of the via-holes 41$a$ and 41$b$ are laid out so as to leave a margin R1 along the k-th level priority direction of the k-th level extension 42. As shown in FIG. 2B, the (k+1)th level layout module 8 designs layouts of a first strip pattern $60_{j-1}$ of the neighboring wiring level (the (k+1)th wiring level), a second strip pattern $60_j$ of the (k+1)th wiring level and a third strip pattern $60_{j+1}$ of the (k+1)th wiring level which extends in the same direction as the k-th level extension 42 extends, in the (k+1)th wiring level ("j" is an integer). And the second strip pattern $60_j$ of the (k+1)th wiring level has an area where the linear arrangement of a plurality of via-holes 41$a$ and 41$b$ can be placed, at a plurality of intersecting points of the parallel lines $X_p$, $X_{p+1}$ and the line $Y_q$ which can leave the margin R2 in the termination.

Under the condition that the k-th wiring level is elected as the subject wiring level, the k-th level interconnect setting logic 21$a$ is called as "the subject level interconnect setting logic", which designs layouts of a first strip pattern $40_{i-1}$ of the subject wiring level, a second strip pattern $40_i$ of the subject wiring level and a third strip pattern $40_{i+1}$ of the subject wiring level which extend in the subject wiring level along the subject level priority direction. And, the k-th level extension setting logic 21$b$ is called as "the subject level extension setting logic", which generates a pattern of a subject level extension 42 configured to extend in an orthogonal direction to the subject level priority direction from a termination of the second strip pattern $4_i$ of the subject wiring level. The (k+1)th level layout module 8 is called as "the neighboring level layout module", which designs layouts of a first strip pattern $60_{j-1}$ of the neighboring wiring level, a second strip pattern $60_j$ of the neighboring wiring level and a third strip pattern $60_{j-1}$ of the neighboring wiring level which extend in the same direction as the subject level extension 42 extends.

As shown in FIG. 2A and FIG. 2B, each of the geometries of the via-holes 41$a$ and the via-holes 41$b$ has a width W1 implemented by the line width of the second strip pattern $40_i$ of the k-th wiring level, and a width W3 implemented by the line width of the second strip pattern $60_j$ of the (k+1)th wiring level to define a square configuration. In the first embodiment of the present invention, the line width W1 and the line width W3 are equal.

As shown in FIG. 1A, the data memory 3 stores wiring information of each level such as the first level wiring information, the second level wiring information, . . . the k-th level wiring information and the (k+1)th level wiring information. Therefore, the data memory 3 includes a plurality of information storage portions such as a first level information storage portion 31 configured to store the first level wiring information, a second level information storage portion 32 configured to store the second level wiring information, a k-th wiring level information storage portion 33 configured to store the k-th level wiring information and a (k+1)th wiring level information storage portion 34 configured to store the (k+1)th level wiring information, etc.

In addition, the CPU 2 has an input/output control unit, although the illustration has been omitted. The input/output control unit controls the operations of the input unit 11, the output unit 12, the main memory 13, the condition setting module 4, the first level layout module 5, the second level layout module 6, the k-th level layout module 7 and the (k+1)th level layout module 8 and various input/output signals corresponding to the above-mentioned operations, etc.

Keyboards, mouse devices and the like implement the input unit 11. Display units, printing apparatuses, such as a liquid crystal displays (LCDs) or a cathode ray tube (CRT) displays implement the output unit 12. A read-only memory (ROM) and a random access memory (RAM) may be built into the main memory 13. The ROM functions as a program memory and the like, configured to store the program executed at the CPU 2. The RAM temporarily stores various data, which are used in the process of the program execution and functions as a data memory, and the like, which is used for a temporary memory configured to store intermediate results.

<1.2 CAD Method>

Figure 3:
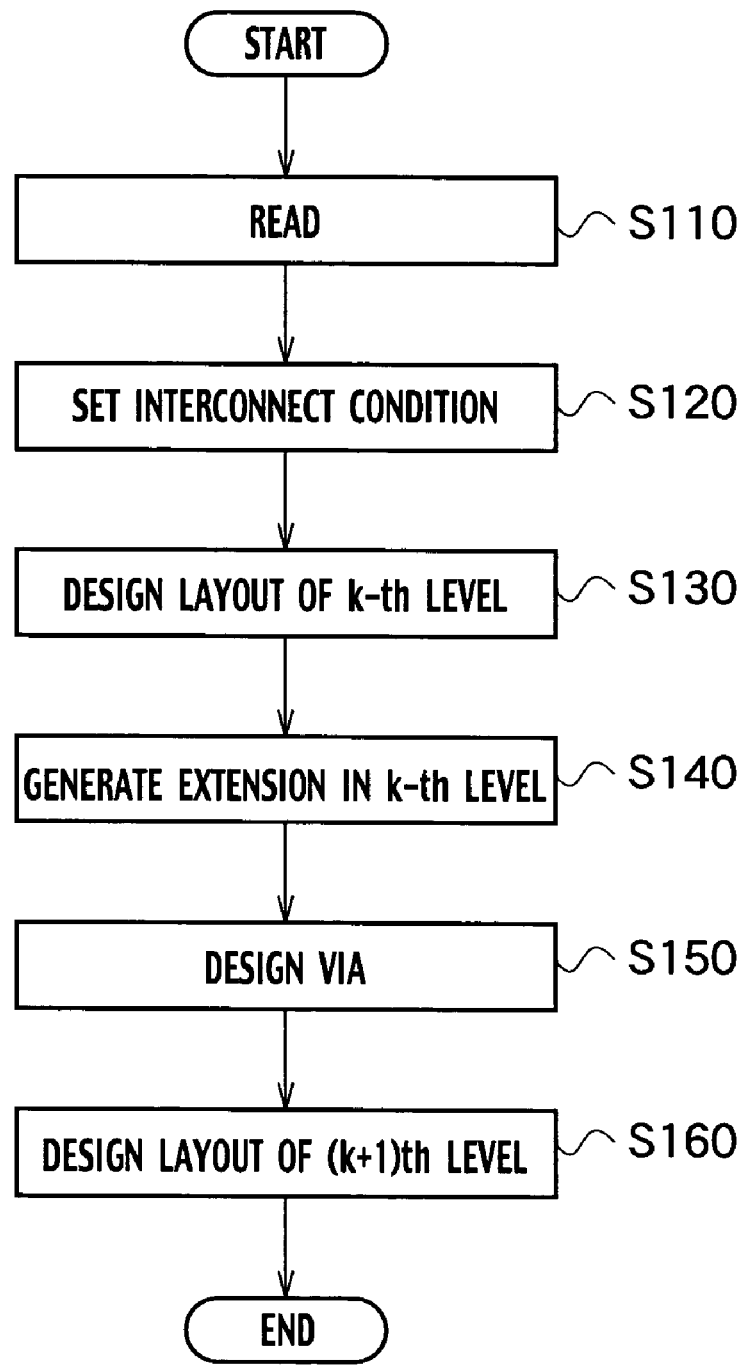
FIG. 3 is a common flowchart showing sequences of CAD methods of the first and second embodiments of the present invention.

Next, with reference to the flowchart shown in FIG. 3, a CAD method according to the first embodiment of the present invention will be described.

(a) First, at a step S110, a subject level wiring information (a k-th level wiring information) are read out from the k-th wiring level information storage portion 33 and an neighboring level wiring information (a (k+1)th level wiring information) are read out from the (k+1)th wiring level information storage portion 34 in the data memory 3 shown in FIG. 1A.

(b) Next, at a step S120, a specific direction of a subject wiring level (k-th wiring level) is decided as "the subject level (k-th level) priority direction" to set an interconnect condition of the k-th wiring level, based on the k-th level wiring information, in reference to a wiring grid which is implemented by the regularly spaced first lines $X_{p-1}$, $X_p$, $X_{p+1}$, . . . and the regularly spaced second lines $Y_{q-1}$, $Y_q$, $Y_{q+1}$, . . . . A direction different from the subject level priority direction of a neighboring wiring level ((k+1)th wiring level) is decided as "the neighboring level ((k+1)th level) priority direction" to set an interconnect condition of the (k+1)th wiring level, based on the (k+1)th level wiring information, in reference to the wiring grid.

(c) Next, at a step S130, as shown in FIG. 2A, a first strip pattern $40_{i-1}$ of the k-th wiring level, a second strip pattern $40_i$ of the k-th wiring level and a third strip pattern $40_{i+1}$ of the k-th wiring level which extend in the k-th wiring level along the k-th level priority direction are designed.

(d) Next, at a step S140, the pattern of the k-th level extension 42 configured to extend in an orthogonal direction to the k-th level priority direction from a termination of the second strip pattern $40_i$ of the k-th wiring level, so that the dimension W2 measured along the k-th level priority direction is larger than the line width W1 of the second strip pattern $40_i$ of the k-th wiring level.

(e) Next, at a step S150, the linear arrangement of a plurality of via-holes 41a and 41b are placed at the intersection points of the parallel lines $X_p$, $X_{p+1}$ and the line $Y_q$ in such a direction as the k-th level extension 42 extends. The patterns of the via-holes 41a and 41b are laid out so as to leave a margin R1 along the k-th level priority direction of the k-th level extension 42.

(f) Next, at a step S160, as shown in FIG. 2B, a first strip pattern $60_{j-1}$ of the neighboring wiring level (the (k+1)th wiring level), the second strip pattern $60_j$ of the (k+1)th wiring level and the third strip pattern $60_{j+1}$ of the (k+1)th wiring level which extend in the same direction as the k-th level extension 42 extends, in the (k+1)th wiring level. And the second strip pattern $60_j$ of the (k+1)th wiring level has an area where the linear arrangement of a plurality of via-holes 41a and 41b are placed, at a plurality of intersecting points of the parallel lines $X_p$, $X_{p+1}$ and the line $Y_q$ which can leave the margin R2 in the termination.

In this manner, according to the CAD method of the first embodiment, the second strip pattern $40_i$ of the k-th wiring level shown in FIG. 2A, encompasses the k-th level extension 42 in the termination, while the via-holes 41a and 41b are laid out so as to leave a margin R1 only along the k-th level priority direction of the k-th level extension 42. And since the second strip pattern $60_j$ of the neighboring wiring level (the (k+1)th wiring level) shown in FIG. 2B, does not encompass the extension region in the termination, it occupies additionally only a single line $X_{p+1}$ adjacent to the second strip pattern $40_i$ of the k-th wiring level. Therefore, it is possible to design multi-level interconnection which prevents the extension region from occupying excessive parallel lines $X_{p-1}$, $X_{p+1}$ located adjacent both sides of the second strip pattern $40_i$ of the k-th wiring level, and from occupying excessive parallel lines $Y_{q-1}$, $Y_{q+1}$, located adjacent both sides of the second strip pattern $60_j$ of the neighboring wiring level (the (k+1)th wiring level).

By electing the first wiring level, the second wiring level, the third wiring level, . . . , the k-th wiring level, the (k+1)th wiring level, . . . , sequentially as the subject wiring level, except the upper most wiring level, and repeating above sequence of steps, a design of a multilevel interconnection can be completed. However, it is possible to omit above sequence of steps in specific wiring levels, according to a requirement of design.

<1.3 Photomask>

Figure 5:
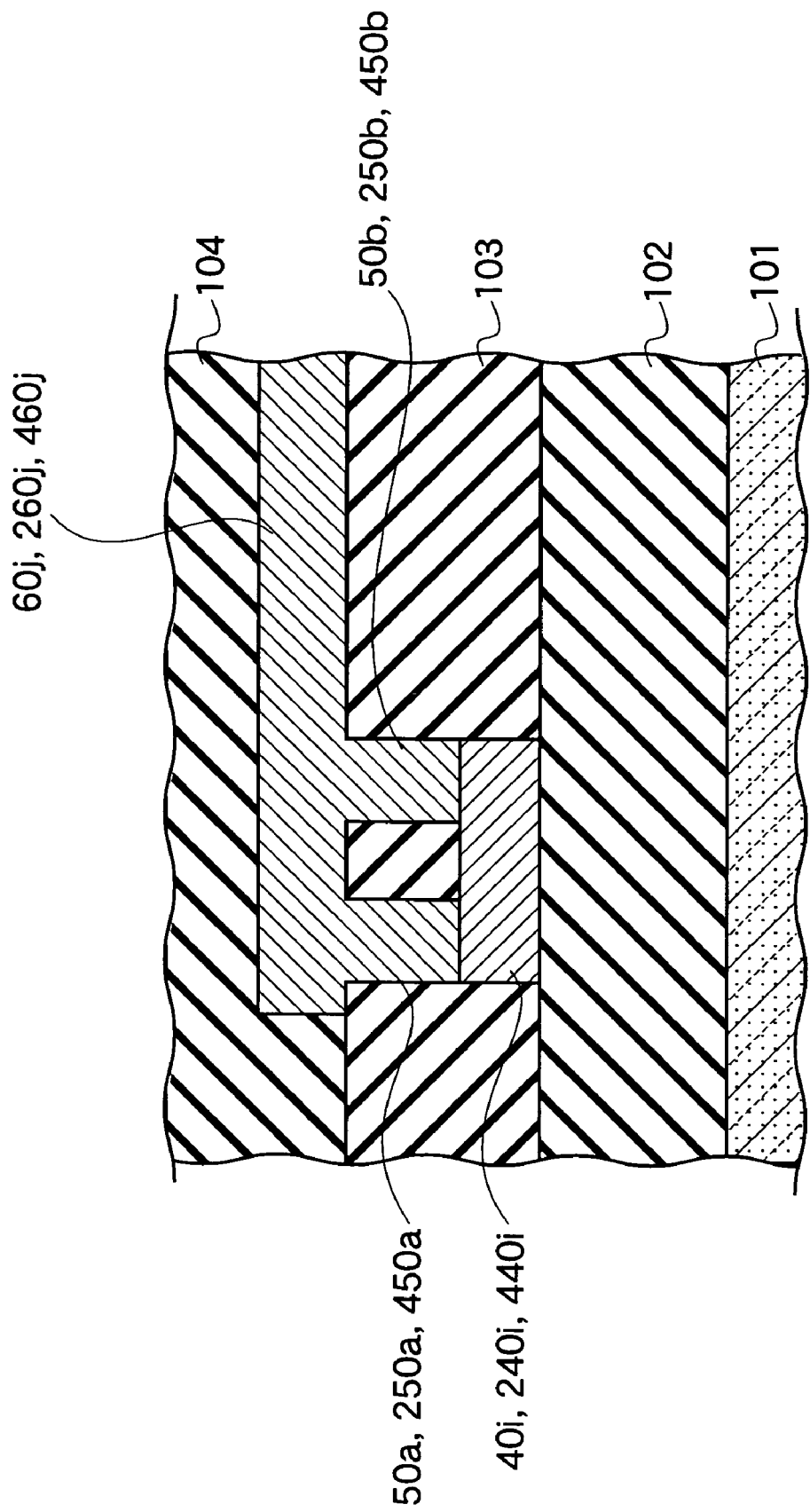
FIG. 5 is a common cross-sectional view showing a representative portion of each of semiconductor integrated circuits according to the first to third embodiments of the present invention.

Next, a set of photomasks for photolithography processes used in a manufacturing of a semiconductor integrated circuit, the set of photomasks are manufactured based on the layout data, which are designed by the CAD method according to the first embodiment of the present invention will be described. The patterns of the photomask can be drawn by a reduction projection printer (stepper) by using design data of mask patterns, to make the wiring geometry having the layout shown in FIG. 2A and FIG. 2B, the wiring of which were designed by the CAD method. The pattern of the photomask is formed in a photomask substrate (a mask substrate) such as fused silica as a pattern of a light shielding film such as chromium (Cr). A combination of photomasks is determined by a device structure as shown in FIG. 5 and a manufacturing process of a subject semiconductor integrated circuit. FIG. 4A to FIG. 4C illustrate three photomasks, encompassing a first photomask, a second photomask and a third photomask as part of the set of photomasks for the photolithography processes used in the manufacturing of the semiconductor integrated circuit. A projected image of the second photomask is aligned with the projected image of the first photomask. And, a projected image of the third photomask is aligned with the projected images of the first photomask and the second photomask.

FIG. 4A shows a part of the first photomask, showing an illustrative site (area) where a first strip pattern of the k-th wiring level $121_{i-1}$, a second strip pattern $121_i$ of the k-th wiring level and a third strip pattern $121_{i+1}$ of the k-th wiring level which are formed by light shielding films to extend along the k-th level priority direction on a first photomask substrate 116. In the above-mentioned site (area), further, a k-th level extension pattern 131 which extends in a direction orthogonal to the k-th level priority direction from a termination of the second strip pattern $121_i$ has been formed so that the dimension W22 measured along the subject wiring level (the k-th wiring level) priority direction is larger than the line width W21 of the second strip pattern $121_i$ of the k-th wiring level.

As shown in FIG. 4B, in the corresponding illustrative site (area) of the second photomask, which is supposed to be aligned with the first strip pattern of the k-th wiring level $121_{i-1}$, the second strip pattern $121_i$ of the k-th wiring level and the third strip pattern $121_{i+1}$ of the k-th wiring level, a plurality of rectangular windows 122a and 122b are formed in a light shielding film on a second photomask substrate 117. The rectangular windows 122a and 122b are so designed that the rectangular windows 122a and 122b can be aligned with the projected image of the first photomask, leaving the margin R1 along the k-th level priority direction, in the region where the image of the k-th level extension pattern 131 is projected as shown in FIG. 4A.

As shown in FIG. 4C, in the corresponding illustrative site (area) of the third photomask, which is supposed to be aligned with the first strip pattern of the k-th wiring level $121_{i-1}$, the second strip pattern $121_i$ of the k-th wiring level and the third strip pattern $121_{i+1}$ of the k-th wiring level, a first strip pattern $123_{j-1}$ of the neighboring wiring level (the (k+1)th wiring level), a second strip pattern $123_j$ of the (k+1)th wiring level and a third strip pattern $123_{j+1}$ of the k+1)th wiring level, which are formed by light shielding films, extending along the same direction as the k-th level extension pattern 131 extends, are delineated on a third photomask substrate 118. Then, the second strip pattern $123_j$ of the (k+1)th wiring level embraces an area where the images of the rectangular windows 122a and 122b are projected within the region of the termination.

Further, protective films such as pellicles may be formed on the light shielding films of the first to third photomasks so as to prevent the generation of pattern defects in the exposure process, otherwise the pattern defects may be generated by any foreign objects dropped on the first to third photomasks.

In this manner, when the first photomask can be aligned together with the second photomask, the position where the rectangular windows 122a and 122b are aligned, is adjusted to the position where the margin R1 is left, only along the k-th level priority direction of the k-th level extension pattern 131. And the second photomask do not have the extension pattern in the termination of the second strip pattern $123_j$ of the neighboring wiring level (the (k+1)th wiring level). Therefore, by using the set of photomasks according to the first embodiment, a semiconductor integrated circuit with a multi-level interconnection can be manufactured, preventing the occurrences of defective connection and preventing decreases in wiring efficiency.

<1.4 Semiconductor Integrated Circuit>

Next, a semiconductor integrated circuit manufactured using the set of photomasks generated by the designing method of the CAD method of the first embodiment will be described. As shown in FIG. 5, a semiconductor integrated circuit includes a semiconductor substrate 101, a first interlevel dielectric film 102 disposed on the semiconductor substrate 101, a subject wiring level (k-th wiring level) 40 disposed on the first interlevel dielectric film 102, a second interlevel dielectric film 103 disposed on the k-th wiring level 40 and the first interlevel dielectric film 102, a plurality of via plugs 50a, 50b disposed on the k-th wiring level 40 and an neighboring wiring level (the k+1)th wiring level) 60 which is disposed on the second interlevel dielectric film 103.

As shown in FIG. 2A, the k-th wiring level 40 includes a subject wiring level strip pattern (the second strip pattern of the k-th wiring level) $40_i$, which is formed by a conductive material extending along the subject wiring level priority direction. Further, the k-th wiring level 40 includes a k-th level extension 42 extending in an orthogonal direction to the k-th level priority direction from a termination of the second strip pattern $40_i$ of the k-th wiring level, so that the dimension W2 measured along the k-th level priority direction is larger than the line width W1 of the second strip pattern $40_i$ of the k-th wiring level. In the second interlevel dielectric film 103, a plurality of via-holes 41a and 41b are formed so that part of the surface of the k-th level extension 42 is exposed. As shown in the plan view of FIG. 2A, the via-holes 41a and 41b are arranged in the area where the margin R1 is left along the subject wiring level priority direction in the k-th level extension 42. As shown in FIG. 5, a plurality of via plugs 50a, 50b are conductors burying the via-holes 41a and 41b. Each of the via plugs 50a, 50b connects to the subject wiring level 40 at a plurality of intersecting points of the parallel lines $X_p$, $X_{p-1}$ and the line $Y_q$, the alignment of a plurality of via plugs 50a, 50b extends along the same direction as the k-th level extension 42 extends. As shown in the plan view of FIG. 2B, the neighboring wiring level (the (k+1)th wiring level) 60 includes the strip pattern $60_j$ of the neighboring wiring level (the k+1th level) which extends along the same direction as the k-th level extension 42 extends, assuring an area where the tops of the via plugs 50a, 50b can be connected to the neighboring wiring level 60, at a plurality of intersecting points of the parallel lines $X_p$, $X_{p+1}$ and the line $Y_q$, where the area leaves the margin R2 in termination.

In addition, the semiconductor integrated circuit includes an interlevel dielectric film 104 disposed on the (k+1)th wiring level 60. And since the semiconductor integrated circuit may have a structure of multi-level interconnection more than triple levels, the nomenclature of "the first or the second interlevel dielectric film" is for convenience sake of the description, and the third, fourth, fifth, . . . . interlevel dielectric films can be included. Actually, when the subject wiring level 40 is the k-th wiring level, a case may be acceptable where there is (k−1)th level under the first interlevel dielectric film 102, and further, another case may be acceptable where there is another interlevel dielectric film on the third interlevel dielectric film 104.

In this manner, the subject wiring level 40 includes the k-th level extension 42 in a termination of the strip pattern $40_i$ of the k-th wiring level, and an area where a plurality of via plugs 50a, 50b are connected, is situated on the position where the margin R1 is left only along the k-th level priority direction of the k-th level extension 42. And the the (k+1)th wiring level 60 does not have the extension region in a termination of the strip pattern $60_j$ of the (k+1)th wiring level. Therefore, it is possible to prevent the occurrences of defective connection, and an improvement in wiring efficiency can be achieved according to the semiconductor integrated circuit of the first embodiment.

Next, a manufacturing method of a semiconductor integrated circuit according to the first embodiment is explained through FIGS. 6A to 6I, showing a process of manufacturing a CMOS integrated circuit, as an example. Still, the manufacturing method of the semiconductor integrated circuit mentioned below, is one example and another various manufacturing methods are also acceptable for realization.

(a) To begin with, preparing the n-type silicon wafer as a semiconductor substrate 101, after forming a thermal oxide film ($SiO_2$) on a main surface of the semiconductor substrate 101, a photoresist film (first photoresist film) is coated on the thermal oxide film and an opening for the p-well formation region is delineated in the photoresist film by photolithography. Next, boron ($^{11}B^+$) ions are implanted through the thermal oxide film in the semiconductor substrate 101 disposed at p-well formation region. Next, removing the photoresist film (first photoresist film) used as the ion implantation mask, after predetermined purification process for the surface of the semiconductor substrate 101, implanted boron ions are activated and thermally diffused at about 1200° C. to form a p-well.

(b) Next, after removing the thermal oxide film formed on the main surface of the semiconductor substrate 101, a new thermal oxide film ($SiO_2$ film) of about 100 nm film thickness is formed again in the main surface of the semiconductor substrate 101. Afterwards, a silicon nitride film ($Si_3N_4$ film) is deposited on the new thermal oxide film using chemical vapor deposition (CVD) method. Then, a new photoresist film (second photoresist film) is coated on the silicon nitride film and an opening for an isolation region scheduled portion is delineated in the new photoresist film (second photoresist film) by photolithography. Then, part of the silicon nitride film at the isolation region scheduled portion is selectively removed by anisotropic etching such as reactive ion etching (RIE) using the new photoresist film as an etching mask so as to expose part of the new thermal oxide film. The exposed thermal oxide film is further etched so as to expose part of the main surface of the semiconductor substrate 101, using the new photoresist film as an etching mask. In addition, an element isolation groove is formed by etching successively the exposed part of the main surface of the semiconductor substrate 101 at the window portion of the silicon nitride film, using the new photoresist film as an etching mask Through the sequence of above processes, a plurality of element formation regions and an element isolation region surrounding the element formation regions are defined, and at this process stage, the silicon nitride films cover the element formation regions. Afterwards, the new photoresist film (second photoresist film) employed as the etching mask is removed. In the bottom of the element isolation groove, a channel-stop ion implantation is executed so as to prevent the generation of an inversion layer at and in the main surface of the semiconductor substrate 101. In addition, an isolation oxide film ($SiO_2$ film) is deposited by CVD method in the element isolation groove. Afterwards, using the silicon nitride film as a stopper, the main surface of the semiconductor substrate 101 is planarized by chemical mechanical polishing (CMP) method, and a shallow trench isolation (STI) structure is formed.

(c) Next, dummy silicon oxide films ($SiO_2$ films) are formed on the surfaces of the element formation regions, after removing the silicon nitride film covering the element formation regions. Next, gate-threshold-voltage-control (Vth-control) ion implantations are executed through the dummy silicon oxide film so as to implant specific ions in the surfaces of the respective element formation regions. Here, a Vth-control-ion-implantation for nMOS transistors is executed after covering the element formation region for pMOS transistors by a photoresist film (third photoresist film) through photolithography. And, a Vth-control-ion-implantation for pMOS translators is executed after covering the element formation region for nMOS transistors by a photoresist film (fourth photoresist film) through photolithography. Afterwards, removing the dummy oxide films used as protective films in the Vth-control ion implantations, gate oxide films are formed on each surface of the element formation regions by thermal oxidation. Next, a polysilicon film (the first thin film) is deposited on the gate oxide film using CVD method.

(d) Then, a still new photoresist film (fifth photoresist film) is coated on the polysilicon film and a gate pattern of the CMOS integrated circuit is delineated in the photoresist film (fifth photoresist film) by photolithography. Then, part of the polysilicon film is selectively etched so as to form gate electrodes for pMOS and nMOS transistors and a polysilicon wiring by anisotropic etching such as RIE. Afterwards, the new photoresist film (fifth photoresist film) is removed. Next, a yet still new photoresist film (sixth photoresist film) is delineated so as to cover the element formation region for nMOS transistors by the photoresist film (sixth photoresist film) through photolithography. Then, using the polysilicon gate electrode of the pMOS transistors as a mask, boron ($^{11}B^+$) ions are implanted in a self-aligned ion implantation. At this process stage, boron ions are also implanted to the polysilicon gate electrode of the pMOS transistors. After removing the photoresist film (sixth photoresist film) employed for the boron implantation, a yet still new photoresist film (seventh photoresist film) is delineated so as to cover the element formation region for pMOS transistors by the photoresist film (seventh photoresist film) through photolithography. Then, using the polysilicon gate electrode of the nMOS transistors as a mask, arsenic ($^{75}As^+$) ions are implanted in a self-aligned ion implantation. At this process stage, arsenic ions are also implanted to the polysilicon gate electrode of the nMOS transistors. Afterwards, the photoresist film (seventh photoresist film) employed for the arsenic implantation is removed. Next, annealing the semiconductor substrate 101 so as to activate and thermally diffuse implanted boron and arsenic ions, n-type source/drain regions are formed in the element formation region for nMOS transistors and p-type source/drain region in the element formation region for pMOS transistors. Here, the resistivity of polysilicon gate electrodes of pMOS and nMOS transistors decrease, because implanted boron and arsenic ions in the polysilicon gate electrodes are also activated.

(e) Next, a first interlevel dielectric film 102 is deposited on the gate electrodes by CVD method, and the like so as to insulate the subject wiring level 40 and the gate electrodes. For example, a silicon oxide film ($CVD-SiO_2$) deposited by CVD method or a composite film implemented by a double-layer structure of phosphosilicate-glass (PSG) film and boro-phosphate-silicate-glass (BPSG) film deposited by CVD method, and the like on the oxide film ($CVD-SiO_2$) are usable for the first interlevel dielectric film 102. The surface of the first interlevel dielectric film 102 is planarized by the upper BPSG of the composite film, through heat-treating by CMP methods, and the like, after piling up by CVD methods, etc.

Figure 6A:
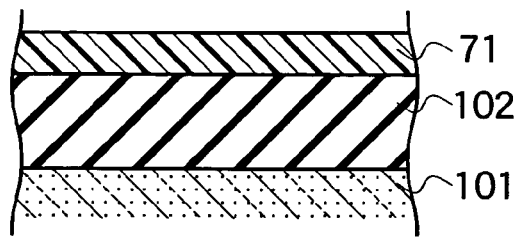
FIG. 6A is a process flow cross sectional view showing a manufacturing method of the semiconductor integrated circuit according to the first embodiment of the present invention.
Figure 6B:
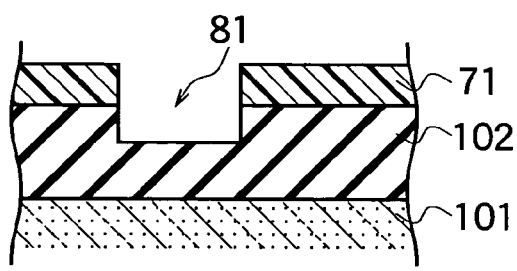
FIG. 6B is a subsequent process flow cross sectional view showing a corresponding part of the semiconductor integrated circuit according to the first embodiment after the process stage shown in FIG. 6A.

(f) Next, as shown in FIG. 6A, a further new photoresist film (seventh photoresist film) (eighth photoresist film) 71 is coated on the first interlevel dielectric film 102. The further new photoresist film (eighth photoresist film) 71 is delineated by photolithography, transferring the image of the first photomask shown in FIG. 4A at ¼~⅕ in reduced size. Next, as shown in FIG. 6B, by using the delineated photoresist film (eighth photoresist film) 71 as an etching mask, part of the first interlevel dielectric film 102 is etched by anisotropic etching such as RIE to a fixed depth so as to form a first damascene groove 81.

Figure 6C:
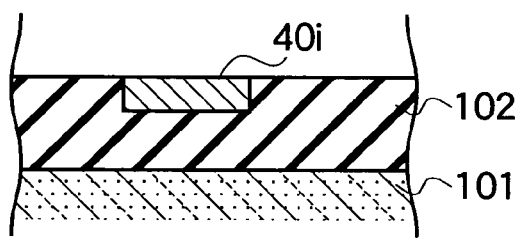
FIG. 6C is a subsequent process flow cross sectional view showing the corresponding part of the semiconductor integrated circuit according to the first embodiment after the process stage shown in FIG. 6B.
Figure 6D:
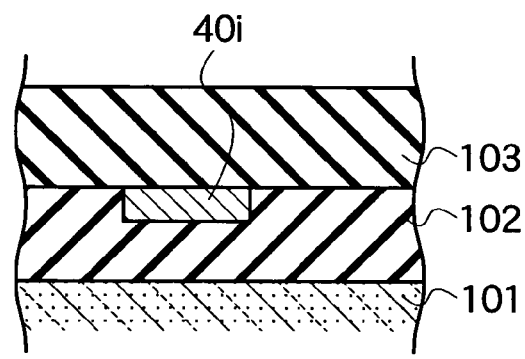
FIG. 6D is a subsequent process flow cross sectional view showing the corresponding part of the semiconductor integrated circuit according to the first embodiment after the process stage shown in FIG. 6C.
Figure 6E:
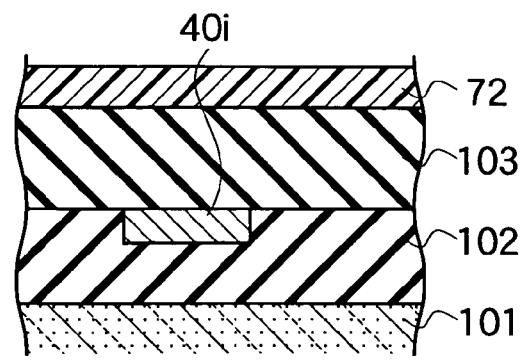
FIG. 6E is a subsequent process flow cross sectional view showing the corresponding part of the semiconductor integrated circuit according to the first embodiment after the process stage shown in FIG. 6D.

(g) Next, after removing the photoresist film (eighth photoresist film) 71, a first conductive film is buried by techniques such as the plating in the first damascene groove 81, as shown in FIG. 6C. The surface of the first interlevel dielectric film 102 is planarized by CMP method so as to form a subject wiring level (k-th wiring level) 40. For example, the first conductive film is copper (Cu). Next, so as to insulate the subject wiring level (k-th wiring level) 40 and the neighboring wiring level ((k+1)th wiring level) 60, as shown in FIG. 6D, the second interlevel dielectric film 103 is deposited on the subject wiring level 40 by CVD method, etc. Next, as shown in FIG. 6E, a further new photoresist film (ninth photoresist film) 72 is coated on the second interlevel dielectric film 103.

Figure 6F:
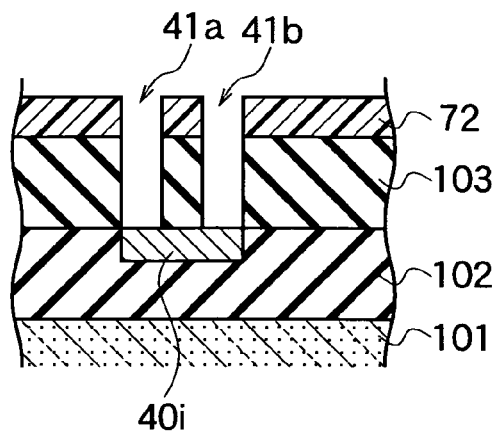
FIG. 6F is a subsequent process flow cross sectional view showing the corresponding part of the semiconductor integrated circuit according to the first embodiment after the process stage shown in FIG. 6E.
Figure 6G:
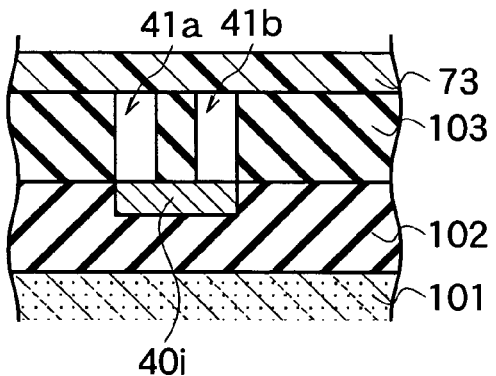
FIG. 6G is a subsequent process flow cross sectional view showing the corresponding part of the semiconductor integrated circuit according to the first embodiment after the process stage shown in FIG. 6F.
Figure 6H:
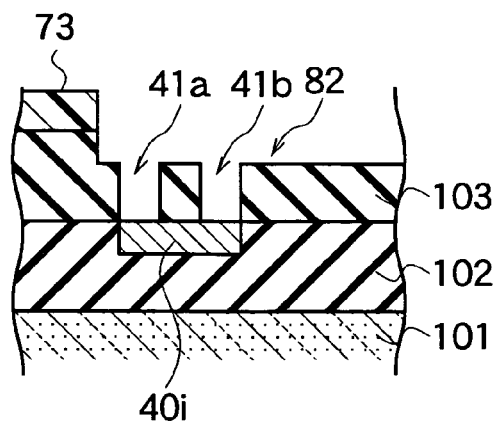
FIG. 6H is a subsequent process flow cross sectional view showing the corresponding part of the semiconductor integrated circuit according to the first embodiment after the process stage shown in FIG. 6G.

(h) After the further new photoresist film (ninth photoresist film) 72 is coated, the ninth photoresist film 72 is delineated by photolithography, and the image of the second photomask as shown in FIG. 4B is transferred (reduction-projected) on the ninth photoresist film 72. Next, as shown in FIG. 6F, using the delineated ninth photoresist film 72 as an etching mask, by anisotropic etching such as RIE, the via-holes 41a and 41b are opened so as to reach the subject wiring level (k-th wiring level) 40, penetrating the second interlevel dielectric film 103. Next, a further new photoresist film (tenth photoresist film) 73 is coated on the second interlevel dielectric film 103, after removing the ninth photoresist film 72, as shown in FIG. 6G. And the tenth photoresist film 73 is delineated by photolithography and the image of the third photomask is transferred (reduction-projected). Next, as shown in FIG. 6H, by using the delineated tenth photoresist film 73 as an etching mask, part of the second interlevel dielectric film 103 is etched by anisotropic etching such as RIE to a fixed depth so as to form a second damascene groove 82.

Figure 6I:
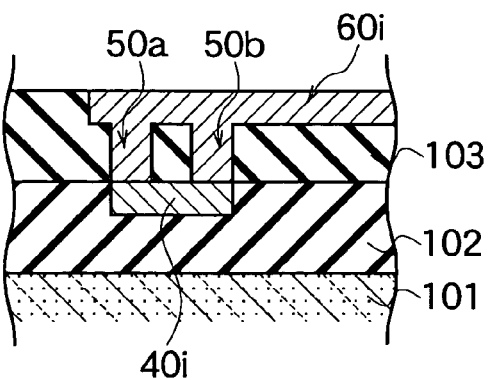
FIG. 6I is a subsequent process flow cross sectional view showing the corresponding part of the semiconductor integrated circuit according to the first embodiment after the process stage shown in FIG. 6H.

(i) Next, as shown in FIG. 6I, a second conductive film is buried by techniques such as plating in the via-holes 41a, 41b and the second damascene groove 82. The surface of the second interlevel dielectric film 103 is planarized by CMP method so as to form the via plugs 50a, 50b and the neighboring wiring level ((k+1)th wiring level) 60. The first conductive film is copper (Cu). Afterwards, the third interlevel dielectric film 104 is deposited on the neighboring wiring level ((k+1)th wiring level) 60 by CVD method, and the like, forming part of a multi-level interconnection as shown in FIG. 5.

(j) In the same manner as the sequence shown from FIG. 6D to FIG. 6I, a further upper wiring level ((k+2)th wiring level) can be formed above the neighboring wiring level

60. That is, by forming necessary multi-level layers including a fourth interlevel dielectric film, a fifth interlevel dielectric film, and . . . , the semiconductor integrated circuit according to the first embodiment is completed. In the most upper wiring level, a passivation film of about 1 μm film thickness is laminated by CVD method, and the like for the purpose of the prevention of mechanical damage and the prevention of the infiltration of water and impurity. PSG film and silicon nitride film, and the like are utilized for a passivation film.

The above-mentioned process can manufacture the semiconductor integrated circuit as shown in FIG. 5, which can prevent the occurrences of connection failures and the decreases in wiring efficiency.

As already mentioned, the manufacturing method explained above is merely one example and the order of the process steps in the sequence of above description can be changed. For example, the third photomask shown in FIG. 4C can be used before the second photomask shown in FIG. 4B.

In the case when transferring the image of the third photomask first than the second photomask, following sequence of process steps is also acceptable:

(a) using the delineated photoresist film 72 as an etching mask, part of the second interlevel dielectric film 103 is etched by anisotropic etching such as RIE to a fixed depth so as to form a second damascene groove 82.

(b) And after removing photoresist film 72, a new photoresist film 73 is coated. And the new photoresist film 73 is delineated by photolithography and the image of the second photomask shown in FIG. 4B is transferred (re-duction-projected).

(c) Next, using the delineated photoresist film 73 as an etching mask, by anisotropic etching such as RIE, the via-holes 41a and 41b are opened so as to reach the subject wiring level 40, penetrating the second interlevel dielectric film 103.

In any way, the above-mentioned manufacturing process is one example, and another sequence of process steps such as forming the p-well, after forming the STI structure may well be used.

<1.5 Computer Program Product>

Also, the computer program for realizing designing methods described in the first embodiment can be stored in the storage medium. The contents of this storage medium can be read by the computer system of the designing tool (CAD tool), the designing tool then executes that computer program, to control the computer so as to realize desired designing methods. Corresponding to the flowchart shown in FIG. 3, the computer program for executing the CAD method of the first embodiment within the designing tool shown in FIG. 1A may include:

(a) Instructions to read out a subject level wiring information (a k-th level wiring information) from the k-th wiring level information storage portion 33 in the data memory 3 shown in FIG. 1A and to read out an neighboring level wiring information (a (k+1)th level wiring information) from the (k+1)th wiring level information storage portion 34 in the data memory 3 (Step S110);

(b) Instructions to determine a direction of a subject wiring level (the k-th wiring level) in a plurality of wiring levels as "the subject wiring level (the k-th wiring level) priority direction" to set an interconnect condition of the k-th wiring level with reference to a wiring grid (Step S120);

(c) Instructions to design a layout of subject wiring level (the k-th wiring level), by placing a plurality of strip patterns, each of the strip patterns extending along the k-th level priority direction in each of wiring levels (Step S130);

(d) Instructions to generate a pattern of "a subject wiring level (the k-th wiring level) extension" which extends in a direction of a wiring grid, the direction of extension is different from the k-th level priority direction, from a termination of one of the k-th wiring level strip patterns, so that a dimension of the extension measured along the k-th level priority direction is larger than a width of the strip pattern in subject wiring level (the k-th wiring level) as shown in FIG. 2A (Step S140);

(e) Instructions to allocate a plurality of via-holes in an area of the extension at the intersecting points of the wiring gird along a direction in which the k-th wiring level extension extend (Step S150); and (f) Instructions to design a layout of an neighboring wiring level (the (k+1)th wiring level) of the subject wiring level, by placing a plurality of strip patterns, each of the strip patterns extending along the same direction as the k-th wiring level extension extends, in the (k+1)th wiring level, assuring a termination area where a plurality of via-holes can be included (Step S160).

By electing the first wiring level, the second wiring level, the third wiring level, . . . , the k-th wiring level, the (k+1)th wiring level, . . . , sequentially as the subject wiring level, except the upper most wiring level, and repeating above sequence of instructions, a design of a multilevel interconnection can be completed. However, it is possible to omit above sequence of instructions in specific wiring levels, according to a requirement of design.

The storage medium from which computer can read the computer program of the first embodiment may include an external memory unit, a semiconductor memory, a magnetic disk, an optical disk, a magneto-optical (MO) disk, a magnetic tape, and other media capable of storing the computer program of the first embodiment. Specifically, the storage medium may include a flexible disk, a compact disk (CD)-ROM, a cassette tape, an open reel tape, and the like For instance, the frame of the designing tool can embraces a flexible disk unit (flexible disk drive) and optical disk unit (optical disk drive) in a built-in configuration or connected to outside. Inserting a flexible disk in the flexible disk drive and a CD-ROM in the optical disk drive from each insertion aperture, and carrying out required readout operations, the computer program stored in the storage medium is installed in the main memory unit 13 shown in FIG. 1. And, for instance, a ROM as a memory unit used for a game pack and a cassette tape as a magnetic tape equipment can be acceptable, by connecting externally a required drive unit. In addition, it is possible to store the computer program in the main memory 13 through a communication network such as an Internet and an intranet.

Modification of the First Embodiment

On the contrary, if we elect the (k+1)th wiring level as "a subject wiring level", the k-th wiring level is "a neighboring wiring level" of the subject wiring level. In this case, the neighboring wiring level is "a lower wiring level" disposed at lower level than the subject wiring level. Then, the k-th level layout module 7 becomes "a neighboring level layout module" configured to layout the neighboring wiring level. And, the (k+1)th level layout module 8 becomes "a subject level layout module" configured to layout the subject wiring level. Then, the condition setting module 4 define one of directions of the subject wiring level as "the subject level priority direction", based on the subject level wiring information, in reference to the wiring grid. However, the subject wiring level may be elected freely other than the k-th wiring level. Actually, to establish a multilevel interconnection, all of the second wiring level, the third wiring level, . . . , the k-th wiring level, the (k+1)th wiring level, . . . and the upper most wiring level can serve sequentially as the role of the subject wiring level, except the first wiring level, when we define the neighboring wiring level as the lower wiring level of the subject wiring level.

As a designing tool according to a modification of the first embodiment of the present invention, such a design methodology can be acceptable that the (k+1)th level layout module 8 generates a pattern of the subject wiring level (the (k+1)th wiring level) extension in the termination of the subject wiring level (the (k+1)th wiring level) strip pattern, instead of the k-th level layout module 7 generating a pattern of the k-th level extension in the termination of the k-th wiring level strip pattern.

Figure 7A:
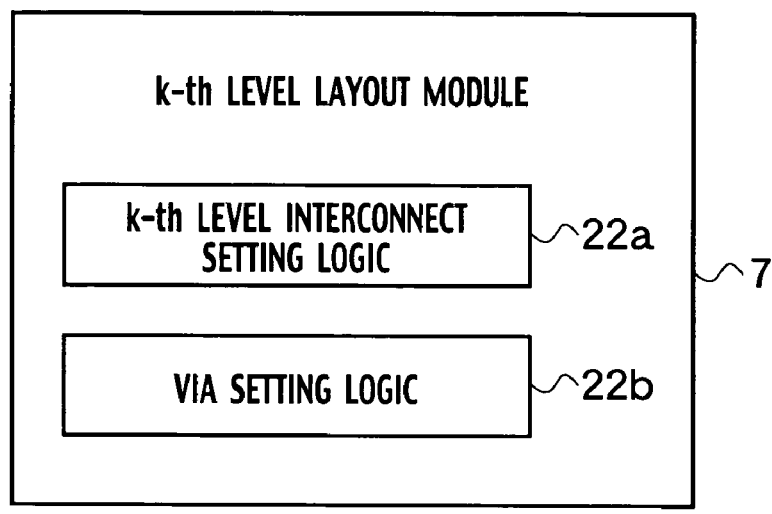
FIG. 7A is a common block diagram showing respective organizations of the k-th level layout module of the designing tools of modifications of the first and second embodiments.
Figure 7B:
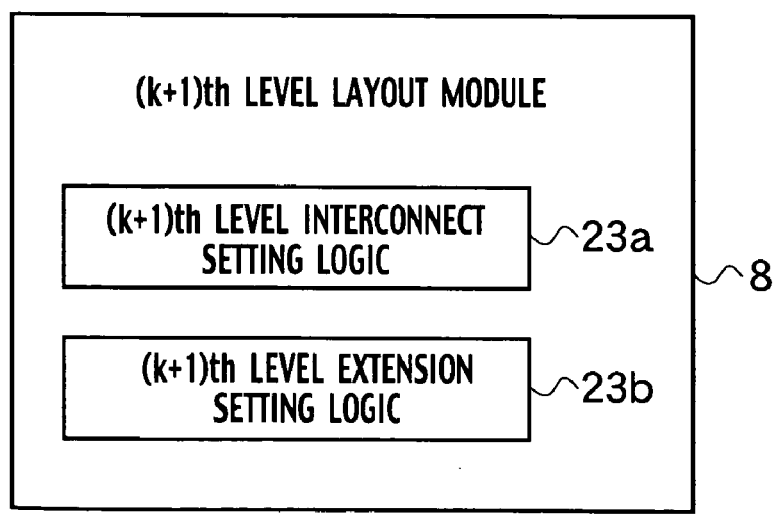
FIG. 7B a common block diagram showing respective organizations of the (k+1)th level layout modules of the designing tools of the modifications of the first and second embodiments.

In other words, as shown in FIG. 7A, the neighboring-level layout module (k-th level layout module) 7 includes a neighboring-level interconnect setting logic (a k-th level interconnect setting logic) 22a and a via setting logic 22b. And, as shown in FIG. 7B, the (k+1)th level layout module 8 includes a subject level interconnect setting logic (a (k+1)th level interconnect setting logic) 23a and a subject level extension setting logic (a (k+1)th level extension setting logic) 23b. The subject-level interconnect setting logic (a (k+1)th level interconnect setting logic) 23a designs a layout of the subject wiring level, by placing a subject-level strip extending along the subject-level priority direction in the subject wiring level. The subject-level extension setting logic (a (k+1)th level extension setting logic) 23b generates a subject-level extension extending in a different direction of the subject-level priority direction, from a termination of the subject-level strip, so that a dimension of the subject-level extension measured along the subject-level priority direction is larger than a width of the subject-level strip.

The via setting logic 22b allocates a plurality of via-holes in the subject-level extension at the intersecting points of the wiring grid along a direction in which the subject-level extension extends. The neighboring-level interconnect setting logic 22a designs a layout of a neighboring wiring level of the subject wiring level in the multi-level interconnection, by placing a neighboring-level strip extending along the same direction as the subject-level extension extends, so that a termination of the neighboring-level strip can include the via-holes.

With reference to the flowchart shown in FIG. 9, a CAD method according to the modification of the first embodiment of the present invention will be described.

(a) At a step S310, the neighboring-level wiring information (the k-th level wiring information) and the subject-level wiring information (the (k+1)th level wiring information) are read out respectively, from the neighboring- wiring-level information storage portion (the k-th wiring level information storage portion) 33 and the subject-wiring-level information storage portion (the (k+1)th wiring level information storage portion) 34 in the data memory 3 shown in FIG. 1A, respectively.

(b) At a step S320, a specific direction of the neighboring wiring level (the k-th wiring level) is decided as "the neighboring-level priority direction (the k-th level priority direction)" to set an interconnect condition of the k-th wiring level, based on the k-th level wiring information, in reference to the wiring grid which is implemented by the regularly spaced first lines $X_{p-1}$, $X_p$, $X_{p+1}$, $X_{p+2}$, . . .
and the regularly spaced second lines $Y_{q-1}$, $Y_q$, $Y_{q+1}$, . . . ("p" and "q" are integers, respectively). A direction of the subject wiring level (the (k+1)th wiring level), which is different from the k-th level priority direction is decided as "the subject-level priority direction (the (k+1)th level priority direction)" to set an interconnect condition of the (k+1)th wiring level, based on the (k+1)th level wiring information, in reference to the wiring grid.

Figure 8A:
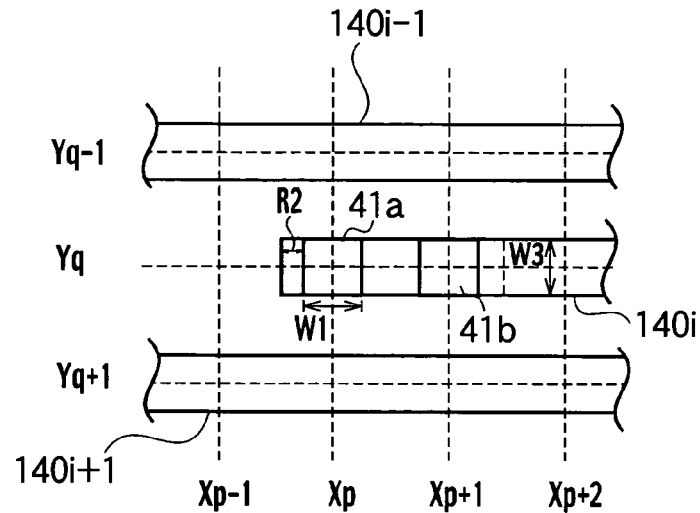
FIG. 8A is a plan view showing a layout design of k-th wiring level which is designed by a designing tool according to the modification of the first embodiment.

(c) At a step S330, as shown in FIG. 8A, the neighboring-level interconnect setting logic (the k-th level interconnect setting logic) 22a designs layouts of a first strip pattern 140$_{i-1}$ of the neighboring wiring level (the k-th wiring level), a second strip pattern 140$_i$ of the k-th wiring level and a third strip pattern 140$_{i+1}$ of the k-th wiring level, which extend in the k-th wiring level along the k-th level priority direction.

(d) At a step S340, the via setting logic 22b arranges linearly a plurality of via-holes 41a and 41b at a plurality of intersecting points of the parallel lines $X_p$, $X_{p+1}$ and the line $Y_q$ along the line of the k-th level priority direction. The linear arrangement of the via-holes 41a and 41b is placed at the position where the margin R2 is left in the termination of the second strip pattern 140$_i$ of the k-th wiring level.

Figure 8B:
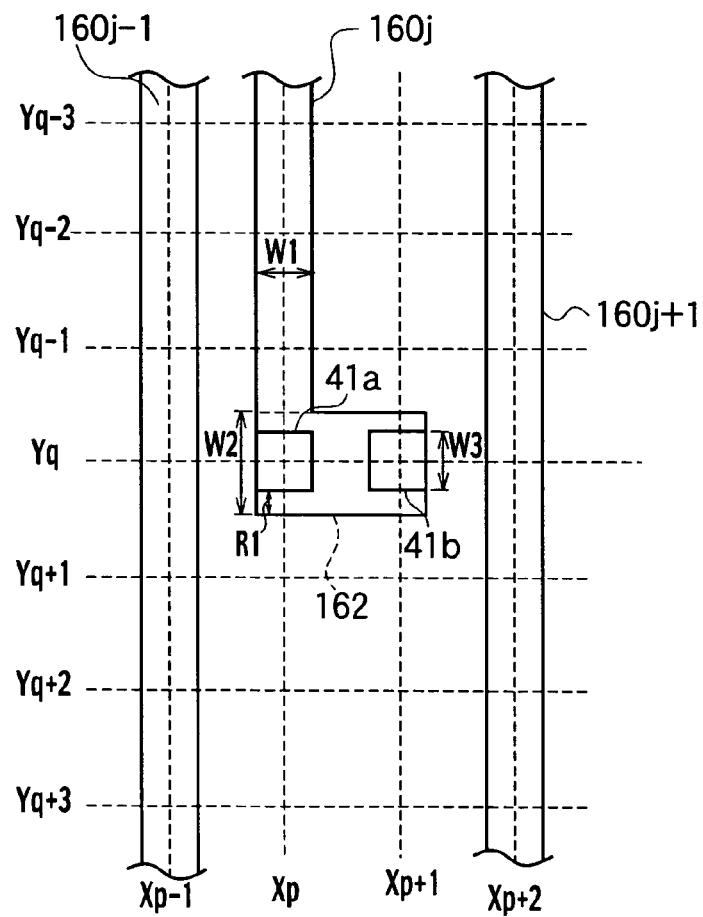
FIG. 8B is a plan view showing a layout design of (k+1)th wiring level which is designed by the designing tool according to the modification of the first embodiment.

(e) As shown in FIG. 8B, at a step S350, the (k+1)th level interconnect setting logic 23a designs layouts of a first strip pattern 160$_{j-1}$ of the subject wiring level (the (k+1)th wiring level), a second strip pattern 160$_j$ of the (k+1)th wiring level and a third strip pattern 160$_{j+1}$ of the (k+1)th wiring level which extend in an orthogonal direction to the k-th level priority direction in the (k+1)th wiring level.

(f) At a step S360, the subject-level extension setting logic (the (k+1)th level extension setting logic) 23b generates a pattern of the subject-level extension (the (k+1)th level extension) 162 which extends along the k-th level priority direction from a termination of the second wiring level 160$_j$ of the (k+1)th wiring level, so that the dimension W2 measured along the second strip pattern 160$_j$ of the (k+1)th wiring level is larger than the line width W1 of the second strip pattern 160$_j$ of the (k+1)th wiring level so as to arrange linearly a plurality of via-holes 41a and 41b at a plurality of intersecting points of the parallel lines $X_p$, $X_{p+1}$ and the line $Y_q$, as shown in FIG. 8B.

According to the k-th level layout module 7 shown in FIG. 7A and the (k+1)th level layout module 8 shown in FIG. 7B, since the second strip pattern 160$_j$ of the (k+1)th wiring level additionally occupies only the single line $X_{p+1}$ which is located adjacent the second strip pattern 160$_j$ of the (k+1)th wiring level, it is possible to design a multi-level interconnection which prevents the extension region from occupying excessive parallel lines $X_{p-1}$, $X_{p+1}$ located adjacent both sides of the second strip pattern 160$_j$ of the (k+1)th wiring level and from occupying excessive parallel lines $Y_{q-1}$, $Y_{q+1}$, located adjacent both sides of the second strip pattern 140$_i$ of the k-th wiring level.

By electing sequentially the second wiring level, the third wiring level, . . . , the k-th wiring level, the (k+1)th wiring level, . . . , the upper most wiring level as the subject wiring level, except the first wiring level, and repeating above sequence of steps, a design of a multilevel interconnection can be completed. However, it is possible to omit above sequence of steps in specific wiring levels, according to a requirement of design.

Also, the computer program for realizing designing methods described in the modification of the first embodiment can be stored in the storage medium. The contents of this storage medium can be read by the computer system of the designing tool (CAD tool), the designing tool then executes that computer program, to control the computer so as to realize desired designing methods. Corresponding to the flowchart shown in FIG. 9, the computer program for executing the CAD method of the modification of the first embodiment within the designing tool shown in FIG. 1A may include:

(a) Instructions to read out the k-th level wiring information and the (k+1)th level wiring information are respectively, from the k-th wiring level information storage portion 33 and the (k+1)th wiring level information storage portion 34 (step S310);

(b) Instructions to determine a specific direction of the k-th wiring level as "the k-th level priority direction" to set an interconnect condition of the k-th wiring level, based on the k-th level wiring information, in reference to the wiring grid (step S320);

(c) Instructions to design layouts a first strip pattern $140_{i-1}$, a second strip pattern $140_i$ and a third strip pattern $140_{i+1}$, which extend in the k-th wiring level along the k-th level priority direction (step S330);

(d) Instructions to allocate a plurality of via-holes 41a and 41b at a plurality of intersecting points of the parallel lines $X_p$, $X_{p+1}$ and the line $Y_q$ along the line of the k-th level priority direction (step S340);

(e) Instructions to design layouts of a first strip pattern $160_{j-1}$, a second strip pattern $160_j$ and a third strip pattern $160_{j+1}$ in an orthogonal direction to the k-th level priority direction in the (k+1)th wiring level (step S350); and (f) Instructions to generate a pattern of the (k+1)th level extension 162 which extends along the k-th level priority direction from a termination of the second wiring level $160_j$ of the (k+1)th wiring level (step S360).

By electing the second wiring level, the third wiring level, . . . , the k-th wiring level, the (k+1)th wiring level, . . . , the upper most wiring level sequentially as the subject wiring level, except the first wiring level, and repeating above sequence of instructions, a design of a multilevel interconnection can be completed. However, it is possible to omit above sequence of instructions in specific wiring levels, according to a requirement of design.

The storage medium from which computer can read the computer program of the modification of the first embodiment may include an external memory unit, a semiconductor memory, a magnetic disk, an optical disk, a MO disk, a magnetic tape, and other media capable of storing the computer program of the modification of the first embodiment. It is possible to store the computer program in the main memory 13 through a communication networks.

Second Embodiment

<2.1 Designing Tool>

As already shown in the common block diagram of FIG. 1A, a designing tool according to a second embodiment of the present invention includes a central processing unit (CPU) 2, a data memory 3, an input unit 11, an output unit 12 and a main memory 13. Herein, only features different from the designing tool according to the first embodiment are mainly described, while the features which are equivalent to those appearing in the first embodiment, are omitted since they are substantially similar.

Figure 10A:
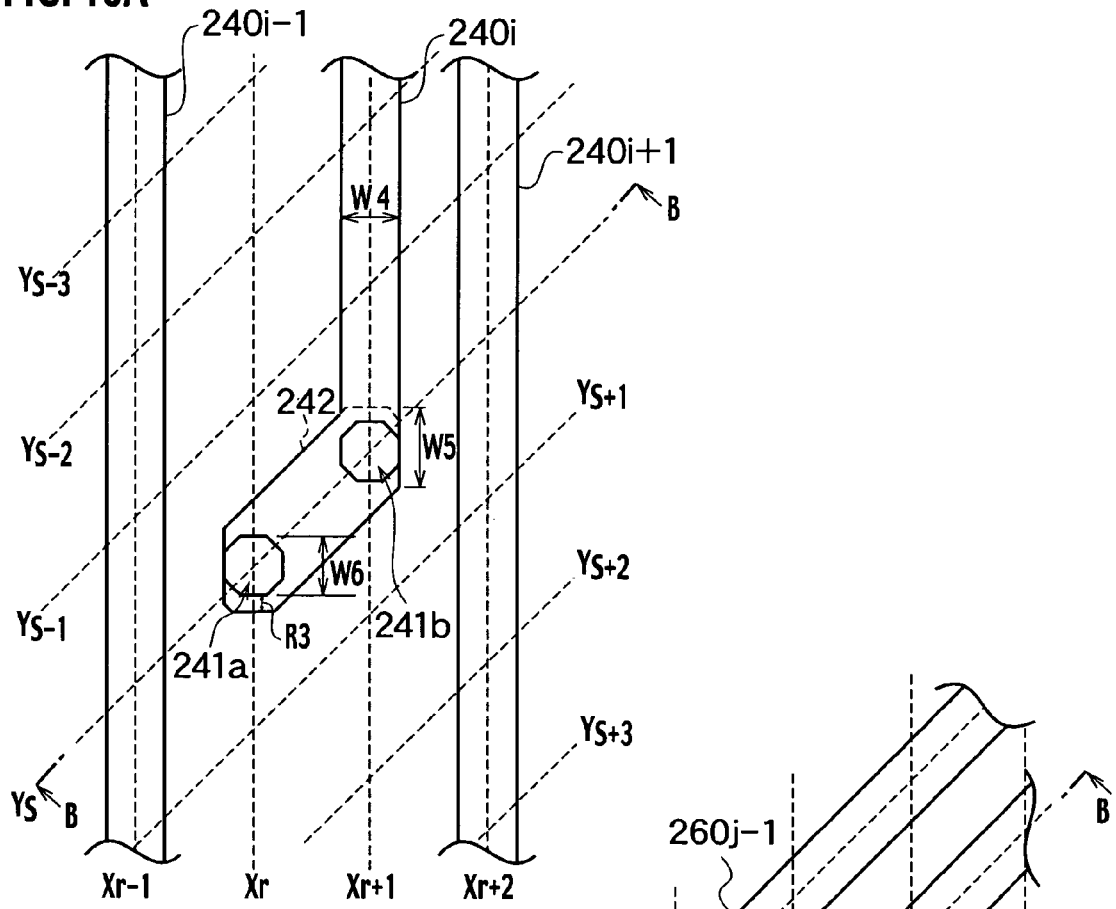
FIG. 10A is a plan view showing a layout design of k-th wiring level which is designed by the designing tool according to the second embodiment.

As shown in FIG. 10A, the k-th level interconnect setting logic 21a shown in FIG. 1B, designs layouts of a first strip pattern $240_{i-1}$ of the k-th wiring level, a second strip pattern $240_i$ of the k-th wiring level and a third strip pattern $240_{i+1}$ of the k-th wiring level which extend in the k-th wiring level along the k-th level priority direction.

The k-th level extension setting logic 21b generates a pattern of a k-th level extension 242 extending in a direction intersecting slantingly against the k-th level priority direction from a termination of the second strip pattern $240_i$ of the k-th wiring level, so that the dimension W5 which was measured along the k-th level priority direction is larger than the line width W4 of the second strip pattern $240_i$ of the k-th wiring level.

The via setting logic 21c arranges linearly a plurality of octagonal via-holes 241a and 241b at the intersection points of the parallel lines $X_r$, $X_{r+1}$ and the line $Y_q$ in such a direction as the k-th level extension 242 extends to ("r" and "s" are integers, respectively). The patterns of the octagonal via-holes 241a and 241b are laid out so as to leave a margin R3 along the k-th level priority direction of the k-th level extension 242.

Figure 10B:
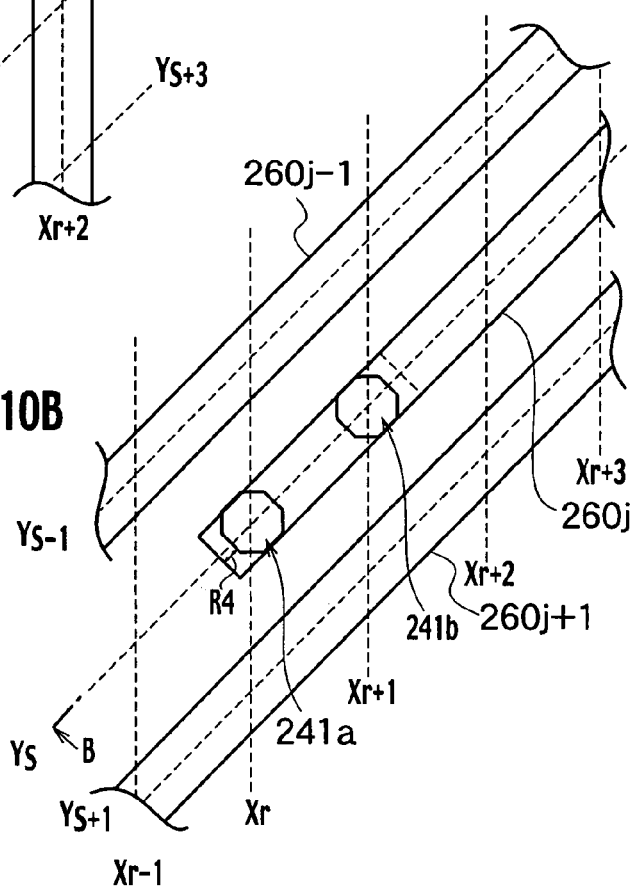
FIG. 10B is a plan view showing a layout design of (k+1)th wiring level which is designed by the designing tool according to the second embodiment.

As shown in FIG. 10B, the (k+1)th level layout module 8 designs layouts of a first oblique strip pattern $260_{j-1}$ of the (k+1)th wiring level, a second oblique strip pattern $260_j$ of the (k+1)th wiring level and a third oblique strip pattern $260_{j+1}$ of the (k+1)th wiring level which extend in the same direction as the k-th level extension 242 extends, in the (k+1)th wiring level. And the second oblique strip pattern $260_j$ of the (k+1)th wiring level has an area where the linear arrangement of a plurality of octagonal via-holes 241a and 241b can be placed so as to leave a margin R4 in the termination.

Similar to the first embodiment, if we elect the k-th wiring level as "a subject wiring level", the (k+1)th wiring level is "a neighboring wiring level" of the subject wiring level. In this case, the neighboring wiring level is "an upper wiring level" disposed at upper level than the subject wiring level. The k-th level layout module 7 becomes "a subject level layout module" configured to layout the subject wiring level. And, the (k+1)th level layout module 8 becomes "a neighboring level layout module" configured to layout the neighboring wiring level. Then, the condition setting module 4 define one of directions of the subject wiring level as "the subject level priority direction", based on the subject level wiring information, in reference to the wiring grid.

Under the condition that the k-th wiring level is elected as the subject wiring level, the k-th level interconnect setting logic 21a is called as "the subject level interconnect setting logic", which designs layouts of a first strip pattern $240_{i-1}$ of the subject wiring level, a second strip pattern $240_i$ of the subject wiring level and a third strip pattern $240_{i+1}$ of the subject wiring level which extend in the subject wiring level along the subject level priority direction. And, the k-th level extension setting logic 21b is called as "the subject level extension setting logic", which generates a pattern of a subject level extension 42 configured to extend in an oblique direction to the subject level priority direction from a termination of the second strip pattern $240_i$ of the subject wiring level. The (k+1)th level layout module 8 is called as "the neighboring level layout module", which designs layouts of a first oblique strip pattern $260_{j-1}$ of the neighboring wiring level, a second oblique strip pattern $260_j$ of the neighboring wiring level and a third oblique strip pattern $260_{j+1}$ of the neighboring wiring level which extend in the same direction as the subject level extension 42 extends.

<2.2 CAD Method>

Next, in reference to the common flowchart of FIG. 3 with the first embodiment, a CAD method according to the second embodiment of the present invention will be described.

(a) First, at a step S110, the subject level (the k-th level) wiring information and the neighboring level (the (k+1)th level) wiring information are read out respectively, from the subject wiring level (k-th wiring level) information storage portion 33 and the neighboring wiring level ((k+1)th wiring level) information storage portion 34 in the data memory 3 shown in FIG. 1A.

(b) Next, at a step S120, a specific direction of the subject wiring level (the k-th wiring level) is decided as "the subject level (the k-th level) priority direction" to set an interconnect condition of the k-th wiring level, based on the k-th level wiring information, in reference to the wiring grid which is implemented by the regularly spaced first lines $X_{r-1}$, $X_r$, $X_{r+1}$, . . . and the regularly spaced second lines $Y_{S3}$, $Y_s$, $Y_{s+1}$, . . . .

(c) Next, at a step S130, as shown in FIG. 10A, the first strip pattern $240_{i+1}$ of the k-th wiring level, the second strip pattern $240_i$ of the k-th wiring level and the third strip pattern $240_{i+1}$ of the k-th wiring level which extend in the k-th wiring level along the k-th level priority direction are designed.

(d) Next, at a step S140, the pattern of the k-th level extension 242 extending in a direction intersecting slantingly against the k-th level priority direction from a termination of the second strip pattern $240_i$ of the k-th wiring level is generated so that the dimension W5 which was measured along the k-th level priority direction is larger than the line width W4 of the second strip pattern $240_i$ of the k-th wiring level.

(e) Next, at a step S150, the linear arrangement of a plurality of octagonal via-holes 241a and 241b are placed at the intersection points of the parallel lines $X_r$, $X_{r+1}$ and the line $Y_s$ in such a direction as the k-th level extension 242 extends.

(f) Next, at a step S160, as shown in FIG. 10B, the first oblique strip pattern $260_{j-1}$ of the neighboring wiring level (the (k+1)th wiring level), the second oblique strip pattern $260_j$ of the (k+1)th wiring level and the third oblique strip pattern $260_{j+1}$ of the (k+1)th wiring level which extend in the same direction as the k-th level extension 242 extends, in the (k+1)th wiring level. And the second oblique strip pattern $260_j$ of the (k+1)th wiring level has an area where the linear arrangement of a plurality of octagonal via-holes 241a and 241b are placed, as the position where the margin R4 is left in the termination.

In this manner, according to the CAD method of the second embodiment, even the wiring layout is such that the second strip pattern $240_i$ of the k-th wiring level shown in FIG. 10A and the second oblique strip pattern $260_j$ of the (k+1)th wiring level shown in FIG. 10B mutually intersect slantingly, since only a single line $X_r$ adjacent the second strip pattern $240_i$ of the k-th wiring level is additionally occupied, it is possible to design a multi-level interconnection which prevents the extension region from occupying excessive parallel lines $X_{r-1}$, $X_{r+2}$ located adjacent both sides of the second strip pattern $240_i$ of the k-th wiring level, and from occupying excessive parallel lines $Y_{s-1}$, $Y_{s+1}$, located adjacent both sides of the second oblique strip pattern $260_j$ of the neighboring wiring level (the (k+1)th wiring level).

<2.3 Photomask>

Next, a set of photomasks for photolithography processes used in a manufacturing of a semiconductor integrated circuit, the set of photomasks are manufactured based on the layout data, which are designed by the CAD method according to the second embodiment of the present invention will be described. FIG. 11A to FIG. 11C illustrate three photomasks, or a first photomask, a second photomask and a third photomask as part of the set of photomasks for the photolithography processes used in the manufacturing of the semiconductor integrated circuit.

FIG. 11A shows part of the layout of the first photomask where a first strip pattern $321_{i-1}$ of the k-th wiring level, a second strip pattern $321_i$ of the k-th wiring level and a third strip pattern $321_{i+1}$ of the k-th wiring level, which extend along the k-th level priority direction. The first strip pattern $321_{i-1}$, a second strip pattern $321i$ and a third strip pattern $321_{i+1}$ are formed by light shielding films delineated on a first photomask substrate 316. And a k-th level extension pattern 331 which extends in a direction intersecting slantingly against the k-th level priority direction from a termination of the second strip pattern $321_i$ is formed so that the dimension W25 measured along the subject wiring level (the k-th wiring level) priority direction is larger than the line width W24 of the second strip pattern $321_i$ of the k-th wiring level.

In the second photomask, as shown in FIG. 11B, octagonal windows 322a and 322b are opened in a light shielding film formed on a second photomask substrate 317. The octagonal windows 322a and 322b are aligned along the k-th level priority direction so as to leave a margin R3 in an area where the image of the k-th level extension pattern 331 as shown in FIG. 11A is supposed to be projected.

In the third photomask, a first oblique strip pattern $323_{j-1}$ of the neighboring wiring level (the (k+1)th wiring level), a second oblique strip pattern $323_j$ of the (k+1)th wiring level and a third oblique strip pattern $323_{j+1}$ of the (k+1l)th wiring level films extend along the same direction as the k-th level extension pattern 331 extends as shown in FIG. 11C. The first oblique strip pattern $323_{j-1}$, the second oblique strip pattern $323_j$ and the third oblique strip pattern $323_{j+1}$ are formed by light shielding films delineated on a third photomask substrate 318.

In this manner, using the set of photomasks according to the second embodiment of the present invention, a semiconductor integrated circuit with a multi-level interconnection which can prevent the occurrences of defective connection and can achieve the improvement in wiring efficiency can be manufactured even the second strip pattern $321_i$ of the k-th wiring level and the second oblique strip pattern $323_i$ of the (k+1)th wiring level are delineated such that they mutually intersects slantingly.

<2.4 Semiconductor Integrated Circuit>

Next, a semiconductor integrated circuit according to the second embodiment will be described. As shown in the common cross-sectional view of FIG. 5, similar to the cross-sectional view of the first embodiment, the semiconductor integrated circuit of the second embodiment includes a semiconductor substrate 101, a first interlevel dielectric film 102 disposed on the semiconductor substrate 101, a subject wiring level (a k-th wiring level) 240 disposed on the first interlevel dielectric film 102, a second interlevel dielectric film 103 disposed on the k-th wiring level 240 and the first interlevel dielectric film 102, a plurality of via plugs 250a, 250b disposed on the k-th wiring level 240 and an neighboring wiring level (the (k+1)th wiring level) 260 disposed on the second interlevel dielectric film 103.

As shown in FIG. 10A, the k-th wiring level 240 includes a subject wiring level strip pattern $240_i$ (the second oblique strip pattern of the k-th wiring level), which is formed by a conductive material extending along the subject wiring level priority direction. Further, the k-th wiring level 240 includes a k-th level extension 242 extending in a direction intersecting slantingly against the k-th level priority direction from a termination of the second strip pattern $240_i$ of the k-th wiring level, so that the dimension W5 measured along the k-th level priority direction is larger than the line width W4 of the second strip pattern $240_i$ of the k-th wiring level. Each bottom of via plugs 250a, 250b connects to the k-th wiring level 240 at each of the intersecting points of the parallel lines $X_r$, $X_{r+1}$ and the oblique line $Y_s$ in the same direction as the k-th level extension 242 extends.

As shown in FIG. 10B, the neighboring wiring level (the (k+1)th wiring level) 260 includes the neighboring wiring level oblique strip pattern $260_j$ (the second oblique strip pattern of the the(k+1)th level) which extends along the same direction as the k-th level extension 242 extends, the configuration assures an area where the tops of the via plugs 250a, 250b can be connected to the (k+1)th wiring level, so as to leave a margin R4 at termination.

In this manner, using the semiconductor integrated circuit according to the second embodiment of the present invention, as shown in FIG. 10A and FIG. 10B, the defective connection can be prevented even the k-th wiring level strip pattern $240_i$ of the subject wiring level 240 and the neighboring wiring level oblique strip pattern $260_j$ of the neighboring wiring level (the (k+1)th wiring level) 260 are so delineated that they mutually intersects slantingly. Furthermore, the semiconductor integrated circuit of the second embodiment can achieve the improvement in wiring efficiency.

<2.5 Computer Program Product>

Also, the computer program for realizing designing methods described in the second embodiment can be stored in the storage medium. The contents of this storage medium can be read by the computer system of the designing tool (CAD tool), the designing tool then executes that computer program, to control the computer so as to realize desired designing methods. Corresponding to the flowchart shown in FIG. 3, the computer program for executing the CAD method of the second embodiment within the designing tool may include:

(a) Instructions to read out the k-th level wiring information and the (k+1)th level wiring information respectively, from the k-th wiring level information storage portion 33 and the (k+1)th wiring level information storage portion 34 (step S110);

(b) Instructions to determine a specific direction of the k-th wiring level as "the k-th level priority direction" to set an interconnect condition of the k-th wiring level, based on the k-th level wiring information, in reference to the wiring grid (step S120);

(c) Instructions to design layouts of the first strip pattern $240_{i-1}$, the second strip pattern $240_i$ and the third strip pattern $240_{i+1}$ extending in the k-th wiring level along the k-th level priority direction (step S130);

(d) Instructions to generate a pattern of the k-th level extension 242 extending in a direction intersecting slantingly against the k-th level priority direction from a termination of the second strip pattern $240_i$ of the k-th wiring level (step S140);

(e) Instructions to allocate a plurality of octagonal via-holes 241a and 241b at intersection points of the parallel lines $X_r$, $X_{r+1}$ and the line $Y_s$ in such a direction as the k-th level extension 242 extends (step S150); and (f) Instructions to design layouts of the first oblique strip pattern $260_{j-1}$, the second oblique strip pattern $260_j$ and the third oblique strip pattern $260_{j+1}$ extending in the same direction as the k-th level extension 242 extends, in the (k+1)th wiring level (step S160).

The storage medium from which computer can read the computer program of the second embodiment may include an external memory unit, a semiconductor memory, a magnetic disk, an optical disk, a MO disk, a magnetic tape, or other media capable of storing the computer program of the second embodiment. It is possible to store the computer program in the main memory 13 through a communication network such as an Internet and an intranet.

Modification of the Second Embodiment

On the contrary, if we elect the (k+1)th wiring level as "a subject wiring level", the k-th wiring level is "a neighboring wiring level" of the subject wiring level. In this case, the neighboring wiring level is "a lower wiring level" disposed at lower level than the subject wiring level. Then, the k-th level layout module 7 becomes "a neighboring level layout module" configured to layout the neighboring wiring level. And, the (k+1)th level layout module 8 becomes "a subject level layout module" configured to layout the subject wiring level. Then, the condition setting module 4 define one of directions of the subject wiring level as "the subject level priority direction", based on the subject level wiring information, in reference to the wiring grid.

Figure 9:
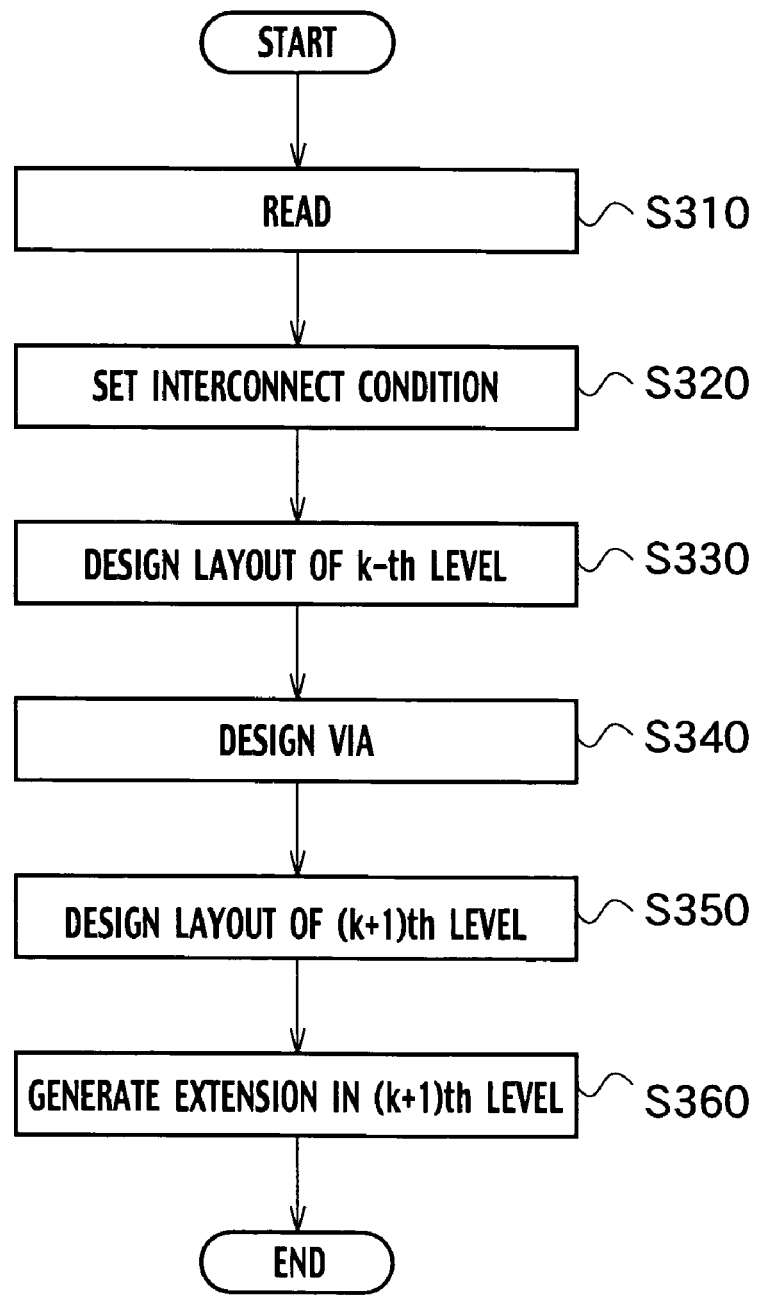
FIG. 9 is a common flowchart showing sequences of CAD methods of the modifications of the first and second embodiments of the present invention.

With reference to the common block diagram of FIGS. 7A and 7B and the common flowchart shown in FIG. 9 with the modification of the first embodiment, a designing tool according to a modification of the second embodiment of the present invention encompasses a subject-level (a (k+1)th level) layout module 8 configured to generate a pattern of a subject wiring level (a (k+1)th wiring level) extension in the termination of the (k+1)th wiring level oblique strip pattern, instead of the k-th level layout module 7 generating the pattern of the k-th level extension in the termination of the k-th wiring level oblique strip pattern.

As shown in FIG. 7A, the neighboring-level (the k-th level) layout module 7 embraces a neighboring-level (a k-th level) interconnect setting logic 22a and a via setting logic 22b, and as shown in FIG. 7B, the subject-level (the (k+1)th level) layout module 8 includes a subject-level (a (k+1)th level) interconnect setting logic 23a and a subject-level (a (k+1)th level) extension setting logic 23b configured to generate the pattern of the k-th level extension.

Figure 12A:
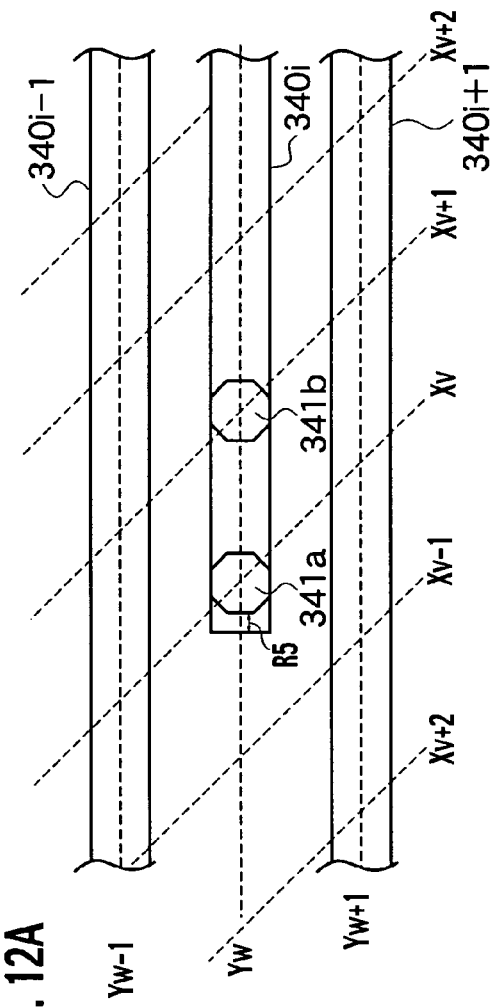
FIG. 12A is a plan view showing a layout design of k-th wiring level which is designed by a designing tool according to a modification of the second embodiment.
Figure 12B:
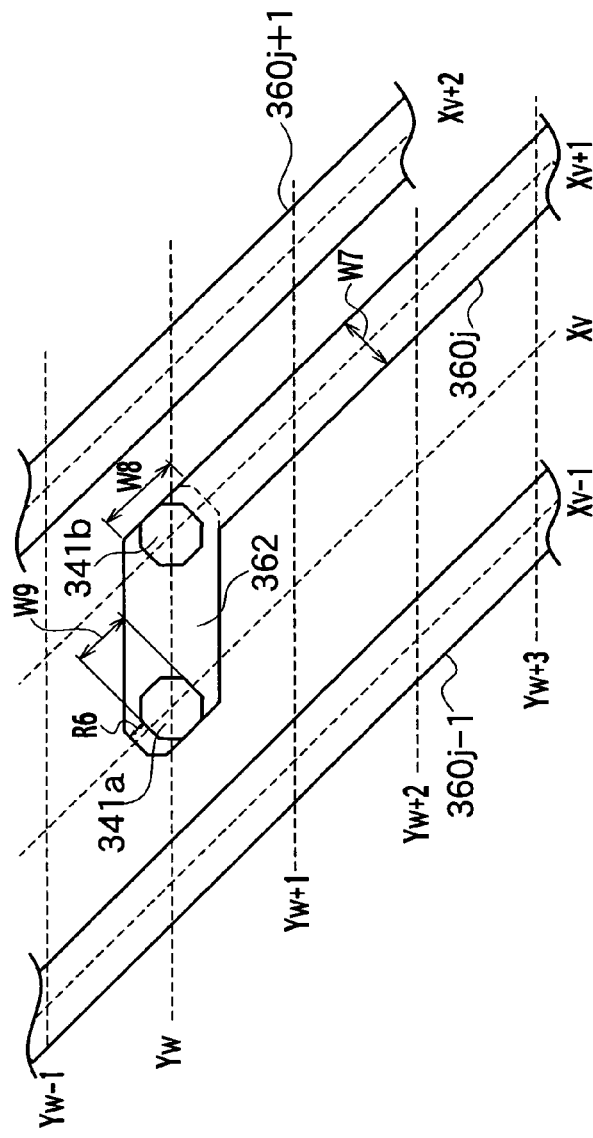
FIG. 12B is a plan view showing a layout design of (k+1)th wiring level which is designed by the designing tool according to the modification of the second embodiment.

The subject-level interconnect setting logic (a (k+1)th level interconnect setting logic) 23a designs a layout of the subject wiring level, by placing a subject-level oblique strip $360_j$ extending along the subject-level priority direction in the subject wiring level as shown in FIG. 12B. The subject-level extension setting logic (a (k+1)th level extension setting logic) 23b generates a subject-level extension 362 extending in a different direction of the subject-level priority direction, from a termination of the subject-level strip, so that a dimension of the subject-level extension measured along the subject-level priority direction is larger than a width of the subject-level strip. The via setting logic 22b allocates a plurality of octagonal via-holes 341a and 341b in the subject-level extension 362 at the intersecting points of the wiring grid along a direction in which the subject-level extension 362 extends. The neighboring-level interconnect setting logic 22a designs a layout of a neighboring wiring level of the subject wiring level in the multi-level interconnection, by placing a neighboring-level strip $340_i$ extending along the same direction as the subject-level extension 362 extends, so that a termination of the neighboring-level strip $340_i$ can include the octagonal via-holes 341a and 341b as shown in FIG. 12A.

With reference to the common flowchart with the modification of the first embodiment shown in FIG. 9, a CAD method according to the modification of the second embodiment of the present invention will be described.

(a) At a step S310, the neighboring-level (k-th level) wiring information and the subject-level ((k+1)th level) wiring information are read out respectively, from the neighboring wiring level (k-th wiring level )information storage portion 33 and the subject wiring level ((k+1)th wiring level) information storage portion 34 in the data memory 3 shown in FIG. 1A. And, at a step S320, a specific direction of the neighboring wiring level (k-th wiring level)is decided as "the neighboring-level (k-th level) priority direction" to set an interconnect condition of the k-th wiring level, based on the k-th level wiring information, in reference to the wiring grid which is implemented by the regularly spaced first lines $X_{v-1}$, $X_V$, $X_{V+1}$, $X_{v-2}$, . . . and the regularly spaced second lines $Y_{w-1}$, $Y_w$, $Y_{w+1}$, . . . ("v" and "w" are integers, respectively). A direction of the subject wiring level (the (k+1)th wiring level), which is different from the k-th level priority direction is decided as "the subject-level ((k+1)th level) priority direction" to set an interconnect condition of the (k+1)th wiring level, based on the (k+1)th level wiring information, in reference to the wiring grid.

(b) At a step S330, as shown in FIG. 12A, the k-th level interconnect setting logic 22a designs layouts of a first strip pattern $340_{i-1}$ of the k-th wiring level, a second strip pattern $340_i$ of the k-th wiring level and a third strip pattern $340_{i+1}$ of the k-th wiring level, which extend in the k-th wiring level along the k-th level priority direction.

(c) At a step S340, the via setting logic 22b arranges linearly a plurality of octagonal via-holes 341a and 341b at a plurality of intersecting points of the oblique parallel lines $X_v$, $X_{v+1}$, and the horizontal line $Y_w$ along the line of the k-th level priority direction. The linear arrangement of the octagonal via-holes 341a and 341b is placed at the position where the margin R5 is left in the termination of the second strip pattern $340_i$ of the k-th wiring level.

(d) At a step S350, as shown in FIG. 12B, the (k+1)th level interconnect setting logic 23a of the FIG. 7B designs layouts of a first oblique strip pattern $360_{j-1}$ of the (k+1)th wiring level, a second oblique strip pattern $360_j$ of the (k+1)th wiring level and a third oblique strip pattern $360_{j+1}$ of the (k+1)th wiring level which extend in a direction intersecting slantingly against the k-th level priority direction in the (k+1)th wiring level.

(e) At a step S360, the (k+1)th level extension setting logic 23b generates a pattern of the (k+1)th level extension 362 which extends along the k-th level priority direction from a termination of the second wiring level $360_j$ of the (k+1)th wiring level, so that the dimension W8 which was measured along the second oblique strip pattern $360_j$ of the (k+1)th wiring level is larger than the line width W7 of the second oblique strip pattern $360_j$ of the (k+1)th wiring level.

According to the k-th level layout module 7 shown in FIG. 7A and the (k+1)th level layout module 8 shown in FIG. 7B, even the wiring layout is such that the second strip pattern $340_i$ of the k-th wiring level of the FIG. 12A and the second oblique strip pattern $360_j$ of the (k+1)th wiring level of the FIG. 12B mutually intersect slantingly, since the second oblique strip pattern $360_j$ of the (k+1)th wiring level occupies additionally only a single line $X_v$ which is located adjacent the second oblique strip pattern $360_j$ of the (k+1)th wiring level, it is possible to design a multi-level interconnection which prevents the extension region from occupying excessive parallel lines $X_{v-1}$, $X_{v+2}$ located adjacent both sides of the second oblique strip pattern $360_j$ of the (k+1)th wiring level and from occupying excessive parallel lines $Y_{w-1}$, $Y_{w+1}$, located adjacent both sides of the second strip pattern $340_i$ of the k-th wiring level.

Third Embodiment

<3.1 Designing Tool>

As already shown in the common block diagram of FIG. 1A, a designing tool according to a third embodiment of the present invention includes a central processing unit (CPU) 2, a data memory 3, an input unit 11, an output unit 12 and a main memory 13. Herein, only features different from the designing tool according to the first embodiment, are mainly described, while the features which are overlapped with the first embodiment are omitted since they are substantially similar.

Figure 13A:
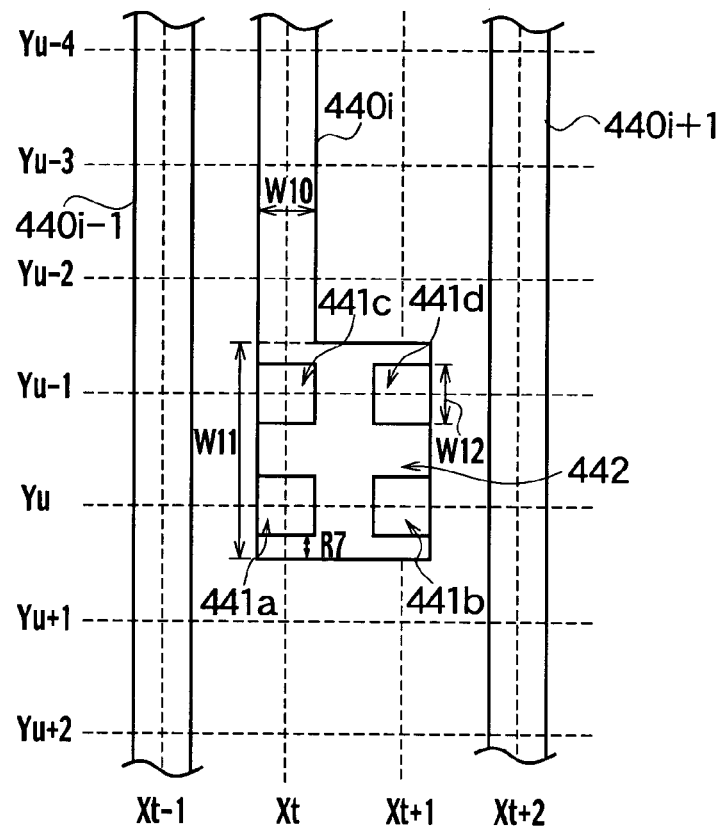
FIG. 13A is a plan view showing a layout design of k-th wiring level which is designed by the designing tool according to the third embodiment.

As shown in FIG. 13A, the k-th level interconnect setting logic 21a shown in FIG. 1B, designs layouts of a first strip pattern $440_{i-1}$ of the k-th wiring level, a second strip pattern $440_i$ of the k-th wiring level and a third strip pattern $440_{i+1}$ of the k-th wiring level which extend in the k-th wiring level along the k-th level priority direction.

The k-th level extension setting logic 21b generates a pattern of a k-th level extension 442 extending in an orthogonal direction to the k-th level priority direction from a termination of the second strip pattern $440_i$ of the k-th wiring level, so that the dimension W11 which was measured along the k-th level priority direction is larger than the line width W10 of the second strip pattern $440_i$ of the k-th wiring level.

The via setting logic 21c arranges linearly a plurality of rectangular via-holes 441a to 441d in a matrix configuration, along the regularly spaced lines which implements the parallel lines $Y_{u-1}$, $Y_u$, configured to run in parallel with a direction as the k-th level extension 442 extends to ("u" is an integer). The patterns of the via-holes 441a to 441d are placed at a plurality of intersecting points of the parallel lines $X_t$, $X_{t+1}$ and the parallel lines $Y_{u-1}$, $Y_u$ ("t" is an integer) by leaving the margin R7 along the k-th level priority direction of the k-th level extension 442.

Figure 13B:
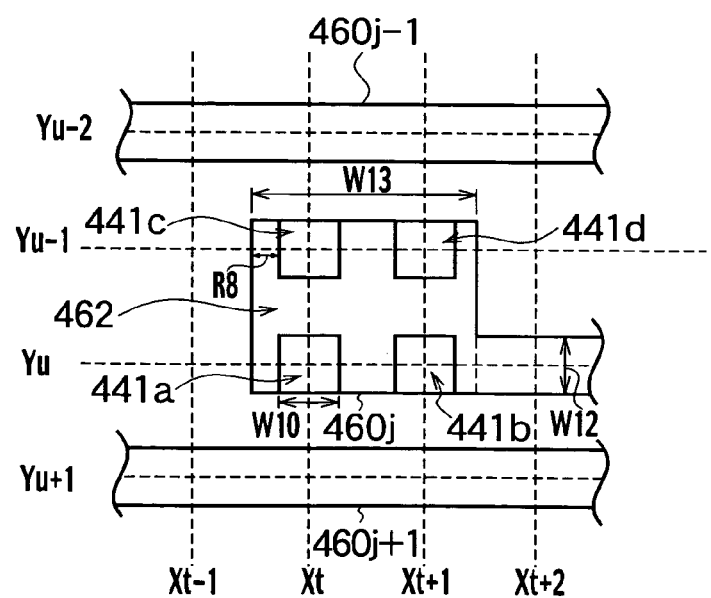
FIG. 13B is a plan view showing a layout design of (k+1)th wiring level which is designed by the designing tool according to the third embodiment.

As shown in FIG. 7B, the (k+1)th level layout module 8 includes the (k+1)th level interconnect setting logic 23a and the (k+1)th level extension setting logic 23b. As shown in FIG. 13B, the (k+1)th level interconnect setting logic 23a designs layouts of a first strip pattern $460_{j-1}$ of the neighboring wiring level (the (k+1)th wiring level), a second strip pattern $460_j$ of the (k+1)th wiring level and a third strip pattern $460_{j+1}$ of the (k+1)th wiring level which extend in the same direction as the k-th level extension 442 extends, in the (k+1)th wiring level.

The (k+1)th level extension setting logic 23b generates a pattern of the (k+1)th level extension 462 which extends along the k-th level priority direction from a termination of the second strip pattern $460_j$ of the (k+1)th wiring level, so that the dimension W13 which was measured along the second strip pattern $460_j$ of the (k+1)th wiring level is larger than the line width W12 of the second strip pattern $160_j$ of the (k+1)th wiring level, so as to arrange in a matrix form a plurality of rectangular via-holes 441a to 441d at a plurality of intersecting points of the parallel lines $X_t$, $X_{t+1}$ and the parallel lines $Y_{u-1}$, $Y_u$.

<3.2 CAD Method>

Figure 14:
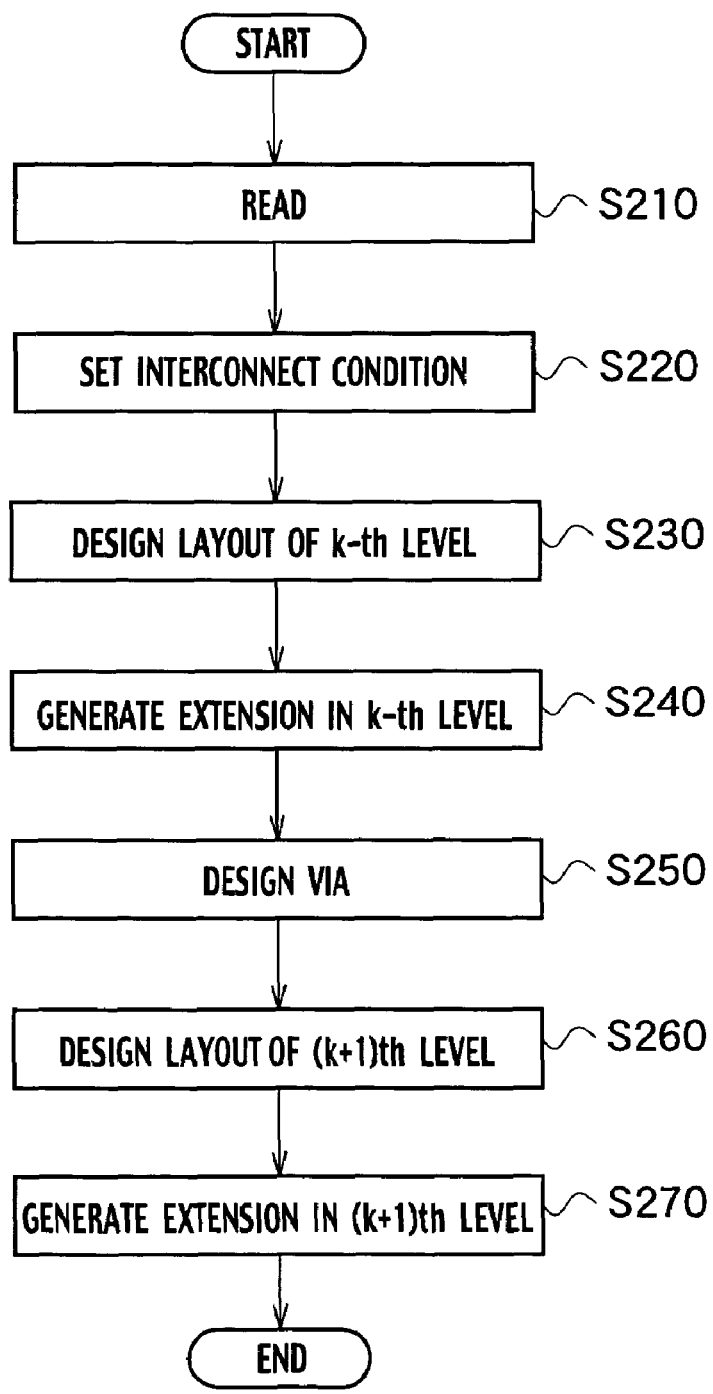
FIG. 14 is a flowchart showing a sequence of the CAD method according to the third embodiment of the present invention.

Next, in reference to the flowchart of FIG. 14, a CAD method according to the third embodiment of the present invention will be described.

(a) First, at a step S210, the k-th level wiring information and the (k+1)th level wiring information are read out respectively, from the k-th wiring level information storage portion 33 and the (k+1)th wiring level information storage portion 34 in the data memory 3 shown in FIG. 1A.

(b) Next, at a step S220, a specific direction of the k-th wiring level is decided as "the k-th level priority direction" to set an interconnect condition of the k-th wiring level, based on the k-th wiring level information, in reference to the wiring grid which is implemented by the regularly spaced first lines $X_{t-1}$, $X_t$, $X_{t+1}$, ... and the regularly spaced second lines $Y_{u-1}$, $Y_u$, $Y_{u+1}$, ....

(c) Next, at a step S230, as shown in FIG. 13A, layouts of the first strip pattern $440_{i+1}$ of the k-th wiring level, the second strip pattern $440_i$ of the k-th wiring level and the third strip pattern $440_{i+1}$ of the k-th wiring level which extend in the k-th wiring level along the k-th level priority direction are designed.

(d) Next, at a step S240, a pattern of the k-th level extension 442 extending in an orthogonal direction to the k-th level priority direction from a termination of the second strip pattern 4401 of the k-th wiring level is generated so that the dimension W11 which was measured along the k-th level priority direction is larger than the line width W10 of the second strip pattern $440_i$ of the k-th wiring level.

(e) Next, at a step S250, the matrix of rectangular via-holes 441a to 441d are placed in a matrix configuration on each of the intersecting point of the parallel lines $X_t$, $X_{t+1}$ and the parallel lines $Y_{u-1}$, $Y_u$.

(f) Next, at a step S260, as shown in FIG. 13B, the first strip pattern $460_{j-1}$ of the neighboring wiring level (the (k+1)th wiring level), the second strip pattern $460_j$ of the (k+1)th wiring level and the third strip pattern $460_{j+1}$ of the (k+1)th wiring level which extend in the same direction as the k-th level extension 442 extends, in the (k+1)th wiring level.

(g) Next, at a step S270, a pattern of the (k+1)th level extension 462 which extends along the k-th level priority direction from a termination of the second strip pattern $460_j$ of the (k+1)th wiring level is generated, so that the matrix of rectangular via-holes 441a to 441d can be included at a plurality of intersecting points of the parallel lines $X_t$, $X_{t+1}$ and the parallel lines $Y_{u-1}$, $Y_u$ in a area defined by the (k+1)th level extension 462.

In this manner, according to the CAD method according to the third embodiment, as shown in FIG. 13A and FIG. 13B, in the wiring layouts in which the pattern of the k-th level extension 442 is generated on the second strip pattern $440_i$ of the k-th wiring level and also the pattern of the (k+1)th level extension 462 is generated on the second strip pattern $460_j$ of the (k+1)th wiring level, since only a single line $X_{t+1}$ adjacent the second strip pattern $440_i$ of the k-th wiring level and a single line $Y_{u-1}$ adjacent the second strip pattern $460_j$ of the (k+1)th wiring level are additionally occupied respectively, it is possible to achieve a structure which can prevent the extension regions from occupying excessive parallel lines $X_{t-1}$, $X_{t+2}$ located adjacent both sides of the second strip pattern $440_i$ of the k-th wiring level and from occupying excessive parallel lines $Y_{u-1}$, $Y_{u+2}$, located adjacent both sides of the second strip pattern $460_j$ of the (k+1)th wiring level.

<3.3 Photomask>

Next, a set of photomasks for photolithography processes used in a manufacturing of a semiconductor integrated circuit, the set of photomasks are manufactured based on the layout data, which are designed by the CAD method according to the third embodiment of the present invention will be described. FIG. 15A to FIG. 15C illustrate three photomasks, or a first photomask, a second photomask and a third photomask as part of the set of photomasks for the photolithography processes used in the manufacturing of the semiconductor integrated circuit.

FIG. 15A shows part of the layout of the first photomask where a first strip pattern $521_{i-1}$ of the k-th wiring level, a second strip pattern $521_i$ of the k-th wiring level and a third strip pattern $521_{i+1}$ of the k-th wiring level which are formed to extend along the k-th level priority direction. The first strip pattern $521_{i-1}$, the second strip pattern $521_i$ and the third strip pattern $521_{i+1}$ are formed by light shielding films delineated on a first photomask substrate 516. And a k-th level extension pattern 531 which extends in a direction orthogonal to the k-th level priority direction from a termination of the second strip pattern $521_i$ is formed so that the dimension W28 measured along the subject wiring level (the k-th wiring level) priority direction is larger than the line width W27 of the second strip pattern $521_i$ of the k-th wiring level.

In the corresponding part of the second photomask, as shown in FIG. 15B, four rectangular windows 522a to 522b are opened in a light shielding film in a matrix configuration, the light shielding film is delineated on the second photomask substrate 517. Each of the columns of rectangular windows 522a, 522c; 522b, 522d are aligned along the k-th level priority direction so as to leave a margin R7, in an area where the image of the k-th level extension pattern 531 shown in FIG. 15A is supposed to be projected.

In the corresponding part of the third photomask, a first strip pattern $523_{j+1}$ of the neighboring wiring level (the (k+1)th wiring level), a second strip pattern $523_j$ of the (k+1)th wiring level and a third strip pattern $523_{j+1}$ of the (k+1)th wiring level which are formed to extend along the same direction as the k-th level extension pattern 531 extends. The first strip pattern $523_{j-1}$, the second strip pattern $523_j$ and the third strip pattern $523_{j+1}$ are formed by light shielding films delineated on a third photomask substrate 518. Further, the (k+1)th wiring level extension pattern 533 which extends along the k-th level priority direction from a termination of the second strip pattern $523_j$ of the (k+1)th wiring level is formed so that the dimension W30 measured along the direction as the second strip pattern $523_j$ of the (k+1)th wiring level extend is larger than the line width W29 of the second strip pattern $523_j$ of the (k+1)th wiring level. Geometry of the (k+1)th wiring level extension pattern 533 is so designed that the projected images of the rectangular windows 522a to 522b can be included in a matrix configuration. The size of the (k+1)th wiring level extension pattern 533 is so designed that a margin R8 is left in such direction as the second strip pattern $523_j$ of the (k+1)th wiring level extends.

In this manner, using the set of photomasks according to the third embodiment of the present invention, a semiconductor integrated circuit with a multi-level interconnection which can prevent the occurrences of defective connection and can achieve the improvement in wiring efficiency can be manufactured, in a configuration such that the k-th level extension pattern 531 is formed on the first photomask, and the (k+1)th wiring level extension pattern 533 is further formed on the third photomask.

<3.4 Semiconductor Integrated Circuit>

Next, a semiconductor integrated circuit according to the third embodiment will be described. As shown in the common cross-sectional view of FIG. 5, similar to the cross-sectional views of the first and second embodiments, a semiconductor integrated circuit includes a semiconductor substrate 101, a first interlevel dielectric film 102 disposed on the semiconductor substrate 101, a subject wiring level (a k-th wiring level) 440 which is disposed on the first interlevel dielectric film 102, a second interlevel dielectric film 103 disposed on the k-th wiring level 440 and the first interlevel dielectric film 102, an neighboring wiring level (the (k+1)th wiring level) 460 disposed on the second interlevel dielectric film 103 and a plurality of via plugs 450*a*, 450*b* disposed between the subject wiring level (the k-th wiring level) 440 and the neighboring wiring level (the (k+1)th wiring level) 460.

As shown in FIG. 13A, the k-th wiring level 440 includes a first strip pattern $521_{i-1}$, a second strip pattern $521_i$ and a third strip pattern $521_{i+1}$, which are formed by conductive materials extending along the subject wiring level priority direction. Further, the k-th wiring level 440 includes a k-th level extension 442 extending in an orthogonal direction to the k-th level priority direction from a termination of the second strip pattern $440_i$ of the k-th wiring level, so that the dimension W11 measured along the k-th level priority direction is larger than the line width W10 of the second strip pattern $440_i$ of the k-th wiring level.

Each of the bottoms of four via plugs 450*a*, 450*b*, . . . connects to the k-th wiring level 440 at each of the intersecting points of the parallel lines $X_t$, $X_{t+1}$ and the parallel lines $Y_{u-1}$, $Y_u$, although the four via plugs 450*a*, 450*b*, . . . are arranged in a matrix configuration, the via plugs 450*a*, 450*b* are arranged in the same direction as the k-th level extension 442 of the FIG. 13A extends.

As shown in FIG. 13B, the neighboring wiring level (the (k+1)th wiring level) 460 includes the a first strip pattern $460_{j-1}$, a second strip pattern $460_j$ and a third strip pattern $460_{j+1}$ which extend in the same direction as the k-th level extension 442 extends, in the (k+1)th wiring level. Further, the (k+1)th wiring level 460 includes a (k+1)th level extension 462 which extends along the k-th level priority direction from a termination of the second strip pattern $460_j$ of the (k+1)th wiring level. The via plugs 450*a*, 450*b* are so arranged in a matrix configuration that each of the top of via plugs 450*a*, 450*b* can be connected to the (k+1)th level extension 462.

In this manner, according to the semiconductor integrated circuit of the third embodiment of the present invention, the occurrences of defective connection are prevented, and a semiconductor integrated circuit can achieve an improvement in wiring efficiency in a configuration in which the k-th wiring level 440 includes the k-th level extension 442 and also the (k+1)th wiring level wiring level 460 includes the (k+1)th level extension 462.

<3.5 Computer Program Product>

Also, the computer program for realizing designing methods described in the third embodiment can be stored in the storage medium. The contents of this storage medium can be read by the computer system of the designing tool (CAD tool), the designing tool then executes that computer program, to control the computer so as to realize desired designing methods. Corresponding to the flowchart shown in FIG. 14, the computer program for executing the CAD method of the third embodiment within the designing tool may include:

(a) Instructions to read out the k-th level wiring information and the k+1)th level wiring information respectively, from the k-th wiring level information storage portion 33 and the (k+1)th wiring level information storage portion 34 (step S210);

(b) Instructions to determine a specific direction of the k-th wiring level as "the k-th level priority direction", based on the k-th level wiring information, in reference to a wiring grid to set an interconnect condition of the k-th wiring level (step S220);

(c) Instructions to design layouts of a first strip pattern $440_{i-1}$, a second strip pattern $440_i$ and a third strip pattern $440_{i+1}$ extending in the k-th wiring level along the k-th level priority direction (step S230);

(d) Instructions to generate a pattern of a k-th level extension 442 extending in an orthogonal direction to the k-th level priority direction from a termination of the second strip pattern $440_i$ (step S240);

(e) Instructions to allocate a matrix of rectangular via-holes 441*a* to 441*d* on each of the intersecting point of the parallel lines $X_t$, $X_{t+1}$ and the parallel lines $Y_{u-1}$, $Y_u$ (step S250);

(f) Instructions to design layouts of a first strip pattern $460_{j-1}$, a second strip pattern $460_j$ and a third strip pattern $460_{j+1}$, extending in the same direction as the k-th level extension 442 extends, in the (k+1)th wiring level(step S260); and (g) Instructions to generate a pattern of a (k+1)th level extension 462 extending along the k-th level priority direction from a termination of the second strip pattern $460_j$ so that the matrix of rectangular via-holes 441*a* to 441*d* can be included at the intersecting points of the parallel lines $X_t$, $X_{t+1}$ and the parallel lines $Y_{u-1}$, $Y_u$ (step S270).

The storage medium from which computer can read the computer program of the present invention may include an external memory unit, a semiconductor memory, a magnetic disk, an optical disk, a MO disk, a magnetic tape, and other media capable of storing the computer program of the present invention. It is possible to store the computer program in the main memory 13 through a communication network such as an Internet and an intranet.

Other Embodiments

Various modifications will become possible for those skilled in the art after receiving the teaching of the present disclosure without departing from the scope thereof.

For example, in the semiconductor integrated circuit according to the third embodiment, the subject wiring level (the k-th wiring level) 440 and the neighboring wiring level (the (k+1)th wiring level) 460 include the k-th level extension 442 and the (k+1)th level extension 462 respectively, and the subject wiring level strip pattern $440_i$ and the neighboring wiring level strip pattern $460_j$ intersect perpendicularly, such a layout may well be used so that the neighboring wiring level strip pattern $460_j$ mutually intersects slantingly against the subject wiring level strip pattern $440_i$.

And the designing tool can acquire the k-th level wiring information, the (k+1)th level wiring information and the via information, and the like through a network. In a case where the k-th level wiring information, the (k+1)th level wiring information and the via information, and the like are obtained through the network, the designing tool may encompass further a communication control so that the designing tool can control the communication with the network.

Thus, the present invention of course includes various embodiments and modifications and the like which are not detailed above. Therefore, the scope of the present invention will be defined in the following claims.

What is claimed is:

1. A computer-aided design method of interconnections of a semiconductor integrated circuit based upon a wiring grid, the wiring grid implemented by a plurality of regularly spaced first lines and a plurality of regularly spaced second lines intersecting with the first lines, comprising:
   determining a direction of a subject wiring level in a multi-level interconnection of semiconductor integrated circuit as a subject-level priority direction with reference to the wiring grid;
   designing a layout of the subject wiring level, by placing a subject-level strip extending along the subject-level priority direction in the subject wiring level;
   generating a subject-level extension extending in a different direction of the subject-level priority direction, from a termination of the subject-level strip, so that a dimension of the subject-level extension measured along the subject-level priority direction is larger than a width of the subject-level strip;
   allocating a plurality of via-holes in the subject-level extension at the intersecting points of the wiring grid along a direction in which the subject-level extension extend, leaving a margin along the subject-level priority direction; and
   designing a layout of a neighboring wiring level of the subject wiring level in the multi-level interconnection, by placing a neighboring-level strip extending along the same direction as the subject-level extension extends, so that a termination of the neighboring-level strip can include the via-holes.

2. The method of claim 1, wherein the second lines intersect orthogonally to the first lines, and the neighboring-level strip extends along an orthogonal direction of the subject-level strip.

3. The method of claim 1, wherein the second lines intersect obliquely to the first lines, and the neighboring-level strip extends along an oblique direction of the subject-level strip.

4. The method of claim 1, further comprising:
   determining a direction of the neighboring wiring level, which is different direction of the subject-level priority direction, as a neighboring-level priority direction with reference to the wiring grid.

5. The method of claim 4, further comprising:
   generating a neighboring-level extension extending in the subject-level priority direction, from a termination of the neighboring-level strip, so that a dimension of the neighboring-level extension measured along the neighboring-level priority direction is larger than a width of the neighboring-level strip.

6. The method of claim 5, wherein:
   the via-holes are allocated in a matrix form in the subject-level extension and the neighboring-level extension at the intersecting points of the wiring grid.

7. A designing tool of interconnections of a semiconductor integrated circuit based upon a wiring grid, the wiring grid implemented by a plurality of regularly spaced first lines and a plurality of regularly spaced second lines intersecting with the first lines, comprising
   a condition setting module configured to determine a direction of a subject wiring level in a multi-level interconnection of semiconductor integrated circuit as a subject-level priority direction with reference to the wiring grid to set an interconnect condition;
   a subject-level interconnect setting logic configured to design a layout of the subject wiring level, by placing a subject-level strip extending along the subject-level priority direction in the subject wiring level;
   a subject-level extension setting logic configured to generate a subject-level extension extending in a different direction of the subject-level priority direction, from a termination of the subject-level strip, so that a dimension of the subject-level extension measured along the subject-level priority direction is larger than a width of the subject-level strip;
   a via setting logic configured to allocate a plurality of via-holes in the subject-level extension at the intersecting points of the wiring grid along a direction in which the subject-level extension extend, leaving a margin along the subject-level priority direction; and
   a neighboring-level interconnect setting logic configured to design a layout of a neighboring wiring level of the subject wiring level in the multi-level interconnection, by placing a neighboring-level strip extending along the same direction as the subject-level extension extends, so that a termination of the neighboring-level strip can include the via-holes.

8. The tool of claim 7, further comprising a neighboring-level extension setting logic configured to generate a neighboring-level extension extending in the subject-level priority direction, from a termination of the neighboring-level, so that a dimension of the neighboring-level extension measured along the neighboring-level priority direction is larger than a width of the neighboring-level strip.

9. The tool of claim 8, wherein the via setting logic allocates the via-holes in a matrix form in the subject-level extension and the neighboring-level extension at the intersecting points of the wiring grid.

10. A photomask set for photolithography used in a manufacturing of a semiconductor integrated circuit, comprising:
   a first photomask configured to form a layout of a subject wiring level in a multi-level interconnection of the semiconductor integrated circuit, the first photomask comprising:
      a pattern of a subject-level strip delineated by a light shielding film to extend along a subject-level priority direction on a first photomask substrate; and
      a pattern of a subject-level extension extending in a different direction of the subject-level priority direction, from a termination of the pattern of the subject-level strip, so that a dimension of the pattern of the subject-level extension measured along the subject-level priority direction is larger than a width of the pattern of the subject-level strip;
   a second photomask aligned with a projected image of the first photomask, the second photomask comprising a plurality of windows formed in a light shielding film on a second photomask substrate, the windows are so designed that the windows can be aligned with the projected image of the subject-level extension, leaving a margin along the subject-level priority direction; and
   a third photomask configured to form a layout of a neighboring wiring level of the subject wiring level, the third photomask comprising a pattern of a neighboring-level strip extending along the same direction as the pattern of the subject-level extension pattern extends, the pattern of the neighboring-level strip is delineated by a light shielding film on a third photomask substrate, such that a termination of the pattern of the neighboring-level strip can include projected images of the windows.

11. The photomask set of claim 10, wherein the third photomask further comprises a pattern of a neighboring-level extension extending in the subject-level priority direction, from a termination of the pattern of the neighboring-level strip, so that a dimension of the pattern of the neighboring-level extension measured along the neighboring-level priority direction is larger than a width of the pattern of the neighboring-level strip.

12. The photomask set of claim 11, wherein the windows of the second photomask are allocated in a matrix form such that the windows can be aligned with the projected image of the subject-level extension and the neighboring-level extension.

13. The photomask set of claim 10, wherein the pattern of the neighboring-level strip extends along a direction orthogonal to a direction in which the pattern of the subject-level strip extends.

14. The photomask set of claim 10, wherein the pattern of the neighboring-level strip extends along a direction oblique to a direction in which the pattern of the subject-level strip extends.

15. A semiconductor integrated circuit, comprising:
a layout of a subject wiring level formed by conductive material in a multi-level interconnection of the semiconductor integrated circuit, the layout of the subject wiring level comprising:
  a subject-level strip to extending along a subject-level priority direction; and
  a subject-level extension extending in a different direction of the subject-level priority direction, from a termination of the subject-level strip, so that a dimension of the subject-level extension measured along the subject-level priority direction is larger than a width of the subject-level strip;
an interlevel dielectric film contacting to the layout of the subject wiring level;
a plurality of via plugs buried in the interlevel dielectric film so as to electrically contact with the subject-level extension, leaving a margin along the subject-level priority direction; and
a layout of a neighboring wiring level of the subject wiring level, the neighboring wiring level comprising a neighboring-level strip extending along the same direction as the subject-level extension pattern extends, a termination of the neighboring-level strip electrically contact with the via plugs.

16. The semiconductor integrated circuit of claim 15, wherein the layout of the neighboring wiring level further comprises a neighboring-level extension extending in the subject-level priority direction, from a termination of the neighboring-level strip, so that a dimension of the neighboring-level extension measured along the neighboring-level priority direction is larger than a width of the neighboring-level strip.

17. The semiconductor integrated circuit of claim 16, wherein the via plugs are allocated in a matrix form such that the via plugs can electrically contact with the subject-level extension and the neighboring-level extension.

18. The semiconductor integrated circuit of claim 16, wherein the neighboring-level strip extends along a direction orthogonal to a direction in which the subject-level strip extends.

19. The semiconductor integrated circuit of claim 16, wherein the neighboring-level strip extends along a direction oblique to a direction in which the subject-level strip extends.

20. A computer program product for executing a design method of interconnections of a semiconductor integrated circuit based upon a wiring grid, the wiring grid implemented by a plurality of regularly spaced first lines and a plurality of regularly spaced second lines intersecting with the first lines within a designing tool, the computer program product comprising:
instructions to determine a direction of a subject wiring level in a multi-level interconnection of semiconductor integrated circuit as a subject-level priority direction with reference to the wiring grid;
instructions to design a layout of the subject wiring level, by placing a subject-level strip extending along the subject-level priority direction in the subject wiring level;
instructions to generate a subject-level extension extending in a different direction of the subject-level priority direction, from a termination of the subject-level strip, so that a dimension of the subject-level extension measured along the subject-level priority direction is larger than a width of the subject-level strip;
instructions to allocate a plurality of via-holes in the subject-level extension at the intersecting points of the wiring grid along a direction in which the subject-level extension extend, leaving a margin along the subject-level priority direction; and
instructions to design a layout of a neighboring wiring level of the subject wiring level in the multi-level interconnection, by placing a neighboring-level strip extending along the same direction as the subject-level extension extends, so that a termination of the neighboring-level strip can include the via-holes.

* * * * *